United States Patent
Takeshima et al.

(10) Patent No.: US 6,970,367 B2
(45) Date of Patent: Nov. 29, 2005

(54) SWITCHING POWER SUPPLY

(75) Inventors: Yoshihiro Takeshima, Matsusaka (JP); Koji Yoshida, Ikoma (JP); Satoshi Ikeda, Suita (JP); Mitsuhiro Matsuo, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/922,230

(22) Filed: Aug. 20, 2004

(65) Prior Publication Data
US 2005/0052888 A1 Mar. 10, 2005

(30) Foreign Application Priority Data
Aug. 20, 2003 (JP) .............................. 2003-296365

(51) Int. Cl.$^7$ ............................................. H02M 1/08
(52) U.S. Cl. ...................................... 363/147; 363/97
(58) Field of Search ............................ 363/95, 97, 125, 363/127, 147

(56) References Cited

U.S. PATENT DOCUMENTS

| | | | | |
|---|---|---|---|---|
| 5,355,301 A | * | 10/1994 | Saito et al. | 363/147 |
| 5,544,038 A | * | 8/1996 | Fisher et al. | 363/147 |
| 5,973,923 A | * | 10/1999 | Jitaru | 361/704 |
| 6,687,143 B2 | * | 2/2004 | Yamamoto et al. | 363/126 |
| 6,891,739 B2 | * | 5/2005 | Nadd et al. | 363/147 |

FOREIGN PATENT DOCUMENTS

JP 6-325949 A 11/1994

* cited by examiner

Primary Examiner—Adolf Berhane
(74) Attorney, Agent, or Firm—McDermott Will & Emery LLP

(57) ABSTRACT

A switching power supply device of the invention includes: a switching circuit for interrupting direct current to generate a pulse voltage; a transformer including a primary winding, a secondary winding, and a core for magnetically coupling the primary winding and the secondary winding; a multi-layer wiring board having wiring lines constituting the primary winding and the secondary winding; a rectifier circuit for rectifying an alternating current; a smoothing circuit for suppressing ripple; and a control circuit for controlling an output voltage from the smoothing circuit. The multi-layer wiring board is provided with at least the switching circuit and the rectifier circuit and is arranged on a main wiring board, and the control circuit is arranged on the main wiring board.

13 Claims, 19 Drawing Sheets

SWITCHING POWER SUPPLY

BACKGROUND OF THE INVENTION

1. Field of the Invention

The present invention relates to a switching power supply device installed in the interior of electronic equipment.

2. Description of the Related Art

Conventionally, power supply devices that are incorporated in electronic equipment, such as personal computers, use a switching power supply device. The switching power supply device is one type of stabilized (regulated) direct current power supply, and is configured so as to output a direct current at a constant voltage by converting a direct current obtained from a power supply, such as a commercial power source or a storage battery, into a pulse voltage having a frequency higher than the audio frequency (about several hundred kilohertz) by a high-speed switching function of semiconductor devices such as transistors, and controlling the pulse width and the pulse interval of the pulse voltage. The switching power supply device thus configured has such features as being capable of outputting a constant output voltage at all times regardless of the fluctuation in power consumption of the load, relatively small in size and weight, and moreover highly efficient. With these features, the switching power supply device has conventionally been used particularly suitably for various information devices and communication devices that incorporate central processing units (hereinafter abbreviated as "CPUs").

FIG. 19 shows schematic views illustrating the configuration of one example of a conventional switching power supply device. FIG. 19A is a side view of the conventional switching power supply device, and FIG. 19B is a top view of the conventional switching power supply device. As shown in FIG. 19, a conventional switching power supply device 1000 has a transformer T, arranged at the center of a printed circuit board P having a plurality of wiring lines configured to form a predetermined electronic circuit. A switching-control circuit U1, switching elements Q1 and Q2, diodes D1 and D2, a capacitor C1 are arranged at respective predetermined positions on the printed circuit board P. The transformer T, the switching-control circuit U1, the switching elements Q1 and Q2, the diodes D1 and D2, and the capacitor C1 are arranged so as to be electrically connected to the wiring lines provided on the printed circuit board P, whereby the switching power supply device 1000 is configured. In the switching power supply device 1000 thus configured, pulse voltage generated by the high-speed switching effect of the switching elements Q1 and Q2 is applied to a primary winding of the transformer T. At this time, an alternating current corresponding to the voltage change of the pulse voltage applied to the primary winding is induced in a secondary winding of the transformer T. Then, the induced alternating current is rectified by the rectification effect of the diodes D1 and D2, and further its ripple is suppressed by the capacitor C1; thus, the obtained direct current is output from an output terminal of the switching power supply device 1000. At this time, the switching-control circuit U1 operates in order to keep the output voltage constant by controlling the ON time and OFF time of the switching elements Q1 and Q2 according to fluctuation of the output voltage. Thus, by using the switching power supply device 1000 that operates in this manner, it becomes possible to supply constant voltage direct current to a fluctuating load at all times. It should be noted here that the conventional switching power supply device 1000 illustrated in FIG. 19 as an example employs a configuration in which all the electronic components for constituting the switching power supply device 1000, such as the transformer T, the switching-control circuit U1, the switching elements Q1 and Q2, the diodes D1 and D2, and the capacitor C1, are arranged on a single printed circuit board P (for example, see Japanese Patent No. 3196187).

In recent years, the tendency in the conditions of electric power supply to CPUs incorporated in electronic equipment including information devices such as personal computers, and communication devices such as mobile telephones, has been toward lower voltage and higher current. For this reason, the switching power supply devices to be incorporated in the above-mentioned information devices and communication devices have also been required to fulfill such a specification that a direct current output at a high current can be obtained. In order to meet such a demand, it is necessary to increase the electric current flowing through the primary winding of the transformer arranged in the switching power supply device. In addition, in order to transmit such a high-current high-frequency switching current and a high-current alternating current induced in the secondary winding of the transformer more efficiently, it is required that wiring lines on the printed circuit board be formed wide. More specifically, a larger width and a shorter length than in conventional devices are required in forming the wiring lines electrically connected to the switching elements, the transformer, the rectifier element, the smoothing element, and the like formed on the printed circuit board. This is necessary to minimize the adverse effects in wiring lines such as parasitic inductance and skin effect and to minimize the power loss within the switching power supply device.

Meanwhile, when the current of the electric power supply from a switching power supply device to a CPU is large, it becomes necessary to take into consideration the effect of voltage drop or the like in the wiring that electrically connects the switching power supply device and the CPU. In order to minimize the effect of the voltage drop or the like in the wiring that electrically connects the switching power supply device and the CPU, it is necessary to arrange the switching power supply device and the CPU so that they are close to each other. More specifically, the wiring line length of the wiring that electrically connects the switching power supply device and the CPU needs to be as short as possible. In order to meet such requirements, the switching power supply device must have as small a size as possible.

Nevertheless, the conventional switching power supply device 1000 employs the configuration in which the constituting elements of the switching power supply device 1000, such as the transformer T, the switching elements Q1 and Q2, the rectifier elements D1 and D2, the capacitor C1, and the switching-control circuit U1, are arranged two-dimensionally on a single printed circuit board P. Accordingly, in cases where wiring lines are formed on a printed circuit board P so as to be sufficiently wide for transmitting a high current high-frequency switching current efficiently as described above, the two-dimensional package density of the electronic components or the like decreases especially in the region in which the switching elements Q1 and Q2, the transformer T, the diodes D1 and D2, the capacitor C1, and so forth are arranged; therefore, it is necessary to increase the size of the printed circuit board P according to the decrease in the package density. Moreover, the conventional switching power supply device 1000 has unused space on the upper face of the printed circuit board P because electronic components with different sizes are arranged thereon together. That is, the configuration of the conventional switching power supply device 1000 has a problem that it is very difficult to reduce the size of a switching power supply device that is highly efficient and capable of outputting a direct current at low voltage and high current.

SUMMARY OF THE INVENTION

The present invention has been accomplished to solve the problems as described above, and its object is to provide a high efficiency and small-sized switching power supply device that is capable of supplying a direct current at low voltage and high current and at a constant voltage irrespective of the power consumption of load.

In order to attain the foregoing and other objects, the present invention provides a switching power supply device comprising: a switching circuit for interrupting direct current to generate a pulse voltage; a transformer including a primary winding, a secondary winding, and a core for magnetically coupling the primary winding and the secondary winding; a multi-layer wiring board having wiring constituting the primary winding and the secondary winding; a rectifier circuit for rectifying an alternating current; a smoothing circuit for suppressing ripple; and a control circuit for controlling an output voltage from the smoothing circuit, the switching power supply device being for outputting a direct current obtained by applying the pulse voltage to a first connecting portion of the primary winding to induce an alternating current in a second connecting portion of the secondary winding, rectifying the alternating current by the rectifier circuit, and smoothing the alternating current by the smoothing circuit, wherein: the multi-layer wiring board is provided with at least the switching circuit and the rectifier circuit and is arranged on a main wiring board, and the control circuit is arranged on the main wiring board. It should be noted herein that the term "direct current (DC)" or "alternating current (AC)" is intended to mean DC or AC voltage or current in the present specification.

By employing such a configuration, it becomes possible to freely design wiring for, for example, a high-current high-frequency switching current flowing through the primary winding and a high-current alternating current induced in the secondary winding in the transformer without taking into consideration the interrelationship with other wiring for configuring a control circuit and the like. Specifically, since the wiring lines for constituting the switching circuit, the transformer, the rectifier circuit, the smoothing circuit, and the like can be formed to be short and wide as necessary, adverse effects in the wiring lines such as conductor resistance, skin effect and parasitic inductance can be minimized. Moreover, the active elements, the passive elements, and the like that constitute a switching power supply device can be arranged three-dimensionally inside the switching power supply device, and therefore, unused space can be dramatically reduced. As a result, an advantageous effect can be obtained that it becomes possible to easily configure a highly efficient, small-sized switching power supply device that is capable of supplying a direct current at low voltage and high current and at a constant voltage irrespective of the power consumption of a load.

The core may have a center leg portion, and the first connecting portion and the second connecting portion of the transformer may be arranged on opposing sides of the center leg portion along the shorter axis of the center leg portion.

By employing such a configuration, it becomes possible to ensure a sufficient electrical insulation distance between the first connecting portion and the second connecting portion in the transformer without reducing the package density of the active elements, the passive elements, and the like to be arranged on the multi-layer wiring board. As a result, an advantageous effect can be obtained that it becomes possible to easily configure a small-sized switching power supply device that is excellent in electrical reliability and safety.

The switching circuit and the rectifier circuit may be respectively arranged on the first connecting portion-side and the second connecting portion-side; and the first connecting portion and the switching circuit, as well as the second connecting portion and the rectifier circuit, may be arranged so as to have a portion in which the first connecting portion is electrically coupled directly with the switching circuit and a portion in which the second connecting portion is electrically coupled directly with the rectifier circuit, respectively.

By employing such a configuration, it becomes possible to form the wiring line for connecting the switching circuit, the rectifier circuit, the smoothing circuit, and the like with the first connecting portion or the second connecting portion of the transformer as short as possible; therefore, the adverse effects originating from the wiring line, such as conductor resistance, skin effect, and parasitic inductance can be suppressed more effectively. As a result, an advantageous effect can be obtained that it becomes possible to easily configure a small-sized switching power supply device that exhibits further enhanced electrical reliability and safety. Furthermore, because the wiring line for connecting the switching circuit, the rectifier circuit, the smoothing circuit, and the like with the first connecting portion or the second connecting portion of the transformer can be partially eliminated, the adverse effects originating from the wiring of the printed circuit board, such as conductor resistance, skin effect and parasitic inductance can be suppressed even more effectively. As a result, an advantageous effect can be obtained that it becomes possible to easily configure a small-sized switching power supply device that exhibits further enhanced electrical reliability and safety.

The above-noted multi-layer wiring board may be arranged on a first major surface of the main wiring board, and the above-noted control circuit may be arranged on a second major surface of the main wiring board.

By employing such a configuration, an advantageous effect can be obtained that even when a control circuit with a complicated circuit configuration needs to be configured or a control circuit needs to be configured using a large number of a plurality kinds of active elements and passive elements having different sizes, it becomes possible to configure the control circuit within a small region without reducing the package density of those elements.

It is also possible that only the control circuit may be arranged on the second major surface of the main wiring board.

By employing such a configuration, an advantageous effect can be obtained that even when a control circuit with a complicated circuit configuration needs to be configured or a control circuit needs to be configured using a large number of a plurality kinds of active elements and passive elements having different sizes, it becomes possible to configure the control circuit within a small region without reducing the package density of those elements. Moreover, the control circuit is completely shielded from the source of high-frequency noise such as switching elements, and therefore, the reliability of the operation of the control circuit can be enhanced. As a result, an advantageous effect can be obtained that it becomes possible to easily configure a small-sized switching power supply device that exhibits further enhanced electrical reliability and safety and that does not cause malfunctions.

It is also possible that the control circuit has a driver unit for driving the switching circuit so that the switching circuit generates the pulse voltage; and the driver unit is arranged on the main wiring board substantially at the shortest distance from the switching circuit and is connected with the switching circuit by a wiring substantially in the shortest distance therefrom.

It is also possible that the control circuit has a driver unit for driving the rectifier circuit so that the rectifier circuit performs the rectification operation; and the driver unit is arranged on the main wiring board substantially at the shortest distance from the rectifier circuit and is connected with the rectifier circuit by a wiring substantially in the shortest distance therefrom.

By employing such a configuration, the parasitic inductance existing in the wiring is minimized, and thereby the electric current suppressing effect caused by the wiring can be reduced. Consequently, an advantageous effect can be obtained that it becomes possible to achieve high-speed switching operation and reduction in switching loss.

The present invention also provides a switching power supply device comprising: a switching circuit for interrupting direct current to generate a pulse voltage; a transformer including a primary winding, a secondary winding, and a core for magnetically coupling the primary winding and the secondary winding; a multi-layer wiring board having wiring constituting the primary winding and the secondary winding; a rectifier circuit for rectifying an alternating current; a smoothing circuit for suppressing ripple; and a control circuit for controlling an output voltage from the smoothing circuit, the switching power supply device being for outputting a direct current obtained by applying the pulse voltage to a first connecting portion of the primary winding to induce an alternating current in a second connecting portion of the secondary winding, rectifying the alternating current by the rectifier circuit, and smoothing the alternating current by the smoothing circuit, wherein: the switching power supply device has a lead frame board in which a heat sink and a wiring layer formed substantially two-dimensionally are stacked with an electrically insulative member interposed therebetween, the electrically insulative member composed of a mixture containing at least an electrically insulative resin and a filler; and the multi-layer wiring board having at least the switching circuit and the rectifier circuit is arranged on the wiring layer of the lead frame board.

By employing such a configuration, it becomes possible to release the heat generated particularly from the switching element, the transformer, the rectifier element, and the like during the operation of the switching power supply device to the outside of the switching power supply device via the lead frame board. That is, even in the case where the switching power supply device is operated for a long time, the temperatures of the switching element, the transformer, the rectifier element, and the like are kept relatively low and stabilized. As a result, the switching power supply device can operate stably over a long period of time. Moreover, an additional advantageous effect can be obtained that destruction of semiconductor elements such as switching elements and rectifier elements over time due to the heat can be reduced.

The core may have a center leg portion, and the first connecting portion and the second connecting portion of the transformer may be arranged on opposing sides of the center leg portion along the shorter axis of the center leg portion.

By employing such a configuration, it becomes possible to ensure a sufficient electrical insulation distance between the first connecting portion and the second connecting portion in the transformer without reducing the package density of the active elements, the passive elements, and the like to be arranged on the multi-layer wiring board. As a result, an advantageous effect can be obtained that it becomes possible to easily configure a small-sized switching power supply device that is excellent in electrical reliability and safety.

The switching circuit and the rectifier circuit may be respectively arranged on the first connecting portion-side and the second connecting portion-side; and the first connecting portion and the switching circuit, as well as the second connecting portion and the rectifier circuit, may be arranged so as to have a portion in which the first connecting portion is electrically coupled directly with the switching circuit and a portion in which the second connecting portion is electrically coupled directly with the rectifier circuit, respectively.

By employing such a configuration, it becomes possible to form the wiring line for connecting the switching circuit, the rectifier circuit, the smoothing circuit, and the like with the first connecting portion or the second connecting portion of the transformer as short as possible; therefore, the adverse effects originating from the wiring line, such as conductor resistance, skin effect, and parasitic inductance can be suppressed more effectively. As a result, an advantageous effect can be obtained that it becomes possible to easily configure a small-sized switching power supply device that exhibits further enhanced electrical reliability and safety. Furthermore, because the wiring line for connecting the switching circuit, the rectifier circuit, the smoothing circuit, and the like with the first connecting portion or the second connecting portion of the transformer can be partially eliminated, the adverse effects originating from the wiring of the printed circuit board, such as conductor resistance, skin effect and parasitic inductance can be suppressed even more effectively. As a result, an advantageous effect can be obtained that it becomes possible to easily configure a small-sized switching power supply device that exhibits further enhanced electrical reliability and safety.

The wiring of the multi-layer wiring board and the wiring layer of the lead frame board may be connected by a portion of the wiring layer extending in a substantially vertical direction.

By employing such a configuration, an advantageous effect can be obtained that it becomes possible to reduce the electrical connection resistance between the wiring of the multi-layer wiring board and the wiring layer of the lead frame board. Moreover, an advantageous effect can be obtained that it becomes possible to dissipate the heat generated from the multi-layer wiring board and the electronic components or the like arranged on the multi-layer wiring board to the lead frame board effectively.

The above-noted electrically insulative resin may be one of epoxy resin, phenolic resin, cyanate resin, fluoroplastic, polyester, polyphenylene-ether, and polyimide.

By employing such a configuration, it becomes possible to improve the heat resistance, the electrical properties, and the like of the lead frame board. Moreover, these electrically insulative resins are readily available. As a consequence, an advantageous effect can be obtained that it becomes possible to easily configure a lead frame board that is excellent in electrical properties and reliability.

The above-noted filler may be one of aluminum oxide, magnesium oxide, boron nitride, aluminum nitride, silicon dioxide, silicon carbide, and ferrite.

By employing such a configuration, the thermal conductivity of the lead frame board can be remarkably improved. Moreover, those inorganic fillers are readily available. As a result, an advantageous effect can be obtained that it becomes possible to easily configure a lead frame board that has a high thermal conductivity and is capable of efficiently releasing the heat generated from switching elements, transformers, rectifier elements, and the like to the outside of the switching power supply device.

The foregoing and other objects, features, and advantages of the present invention will be made apparent from the following detailed description of preferred embodiments with reference to the accompanying drawings.

BRIEF DESCRIPTION OF THE DRAWINGS

FIG. 3 shows cross-sectional views schematically illustrating the internal configuration of a transformer of the switching power supply device shown in FIGS. 1 and 2, in which

FIG. 9 shows configuration diagrams schematically illustrating a switching power supply device according to the first preferred embodiment of the present invention in which a driver unit is arranged in the vicinity of the switching circuit, wherein

FIG. 15 is a configuration diagram schematically illustrating the configuration of a switching power supply device according to the third preferred embodiment of the present invention in which driver units are arranged in the vicinity of the switching circuit and the rectifier circuit, wherein

FIG. 19 shows configuration diagrams schematically illustrating the structure of a conventional switching power supply device, wherein

DETAILED DESCRIPTION OF THE INVENTION

Hereinbelow, preferred embodiments of the present invention are detailed with reference to the drawings.

First Preferred Embodiment

Figure 4:
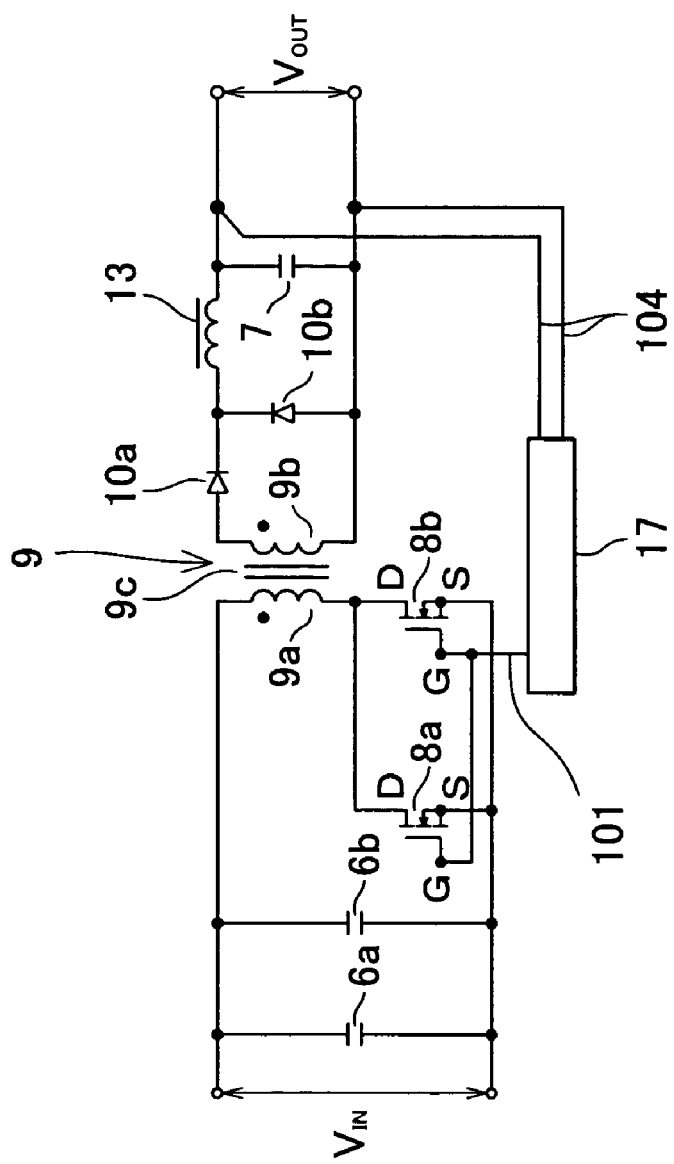
FIG. 4 is a circuit diagram of a switching power supply device according to the first preferred embodiment of the present invention that adopts a forward-type converter circuit.

FIG. 4 is a circuit diagram of a switching power supply device 100 according to a first preferred embodiment of the present invention. As shown in FIG. 4, the switching power supply device 100 described in the present embodiment comprises: input smoothing capacitors 6a and 6b; n-channel type MOS field-effect transistors (hereafter abbreviated as "MOSFETs") 8a and 8b; a transformer 9 including a transformer primary winding 9a, a transformer secondary winding 9b, and a transformer core 9c (the turns ratio being N:1); first and second diodes 10a and 10b; an inductance 13; an output smoothing capacitor 7; and a control circuit 17. These active elements and passive elements are electrically connected to form a predetermined circuit, and thus the switching power supply device 100 is configured.

The circuit diagram of the switching power supply device 100 described in the present embodiment will be explained in detail with reference to FIG. 4. A direct current voltage $V_{IN}$, which is applied from outside, is applied to both terminals of the input smoothing capacitors 6a and 6b. One of the terminals of each of the input smoothing capacitors 6a and 6b are connected to one of the terminals of the transformer primary winding 9a of the transformer 9, and further, the other one of the terminals of each of the input smoothing capacitors 6a and 6b are connected to the source terminals of the MOSFETs 8a and 8b. The other terminal of the transformer primary winding 9a of the transformer 9 is connected to the drain terminals of the MOSFETs 8a and 8b.

The gate terminals of the MOSFETs 8a and 8b are connected to the control circuit 17 by a wiring line 101.

The transformer secondary winding 9b of the transformer 9 is magnetically connected to the transformer primary winding 9a by the transformer core 9c. Consequently, an alternating current corresponding to the change in the voltage applied to the transformer primary winding 9a is generated in the transformer secondary winding 9b. One of the terminals of the transformer secondary winding 9b of the transformer 9 is connected to the anode terminal of the first diode 10a. The other terminal of the transformer secondary winding 9b of the transformer 9 is connected to the anode terminal of the second diode 10b. The cathode terminal of the first diode 10a and the cathode terminal of the second diode 10b are connected to each other, and further connected to one of the terminals (input side) of the inductance 13. The other terminal (output side) of the inductance 13 is connected to one of the terminals of the output smoothing capacitor 7, and the other terminal of the output smoothing capacitor 7 is connected to the anode terminal of the second diode 10b. A direct current voltage $V_{OUT}$ is output from both ends of the output smoothing capacitor 7.

Figure 1:
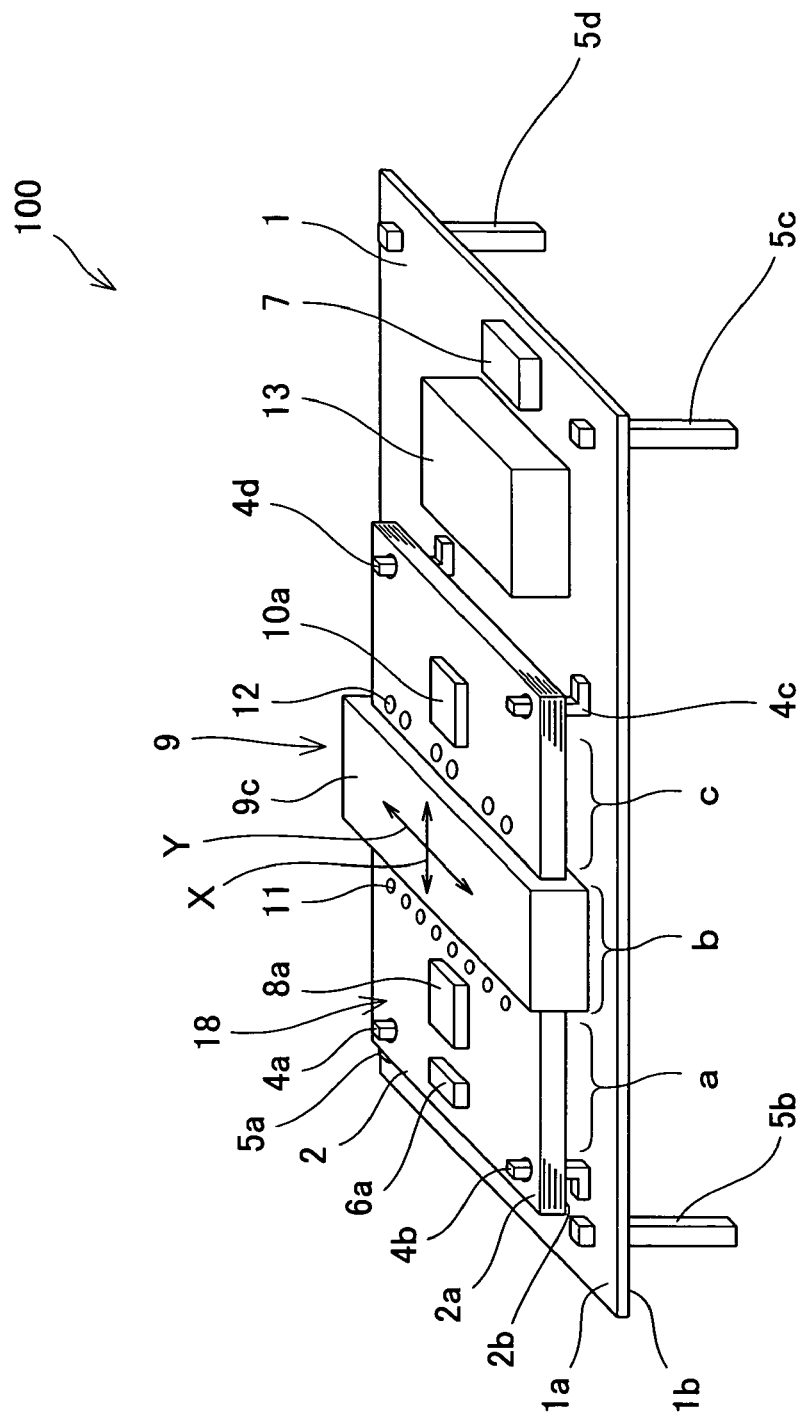
FIG. 1 is an oblique view schematically illustrating a switching power supply device according to a first preferred embodiment of the present invention.
Figure 2:
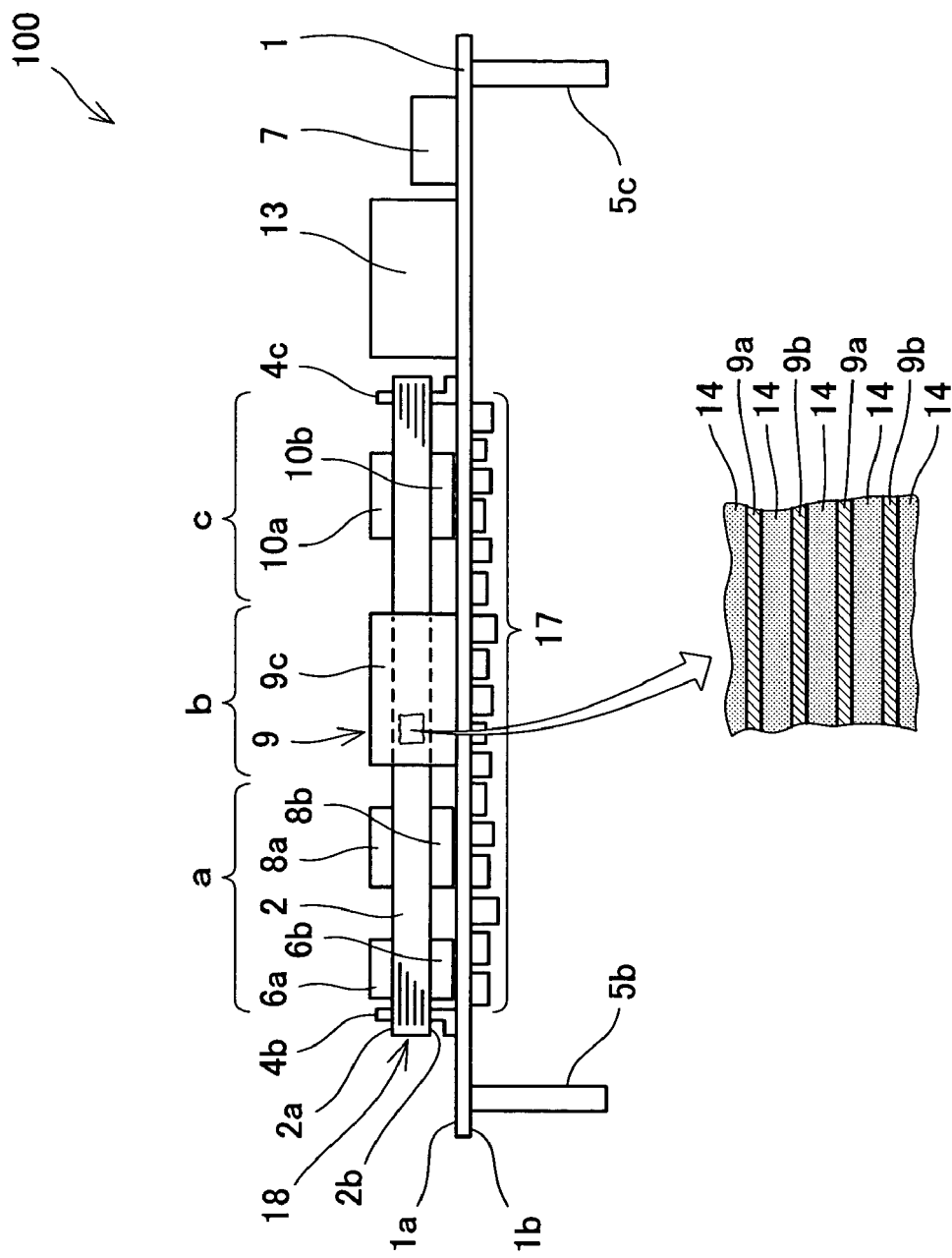
FIG. 2 is a side view schematically illustrating the configuration of a switching power supply device according to the first preferred embodiment of the present invention.
Figure 3A:
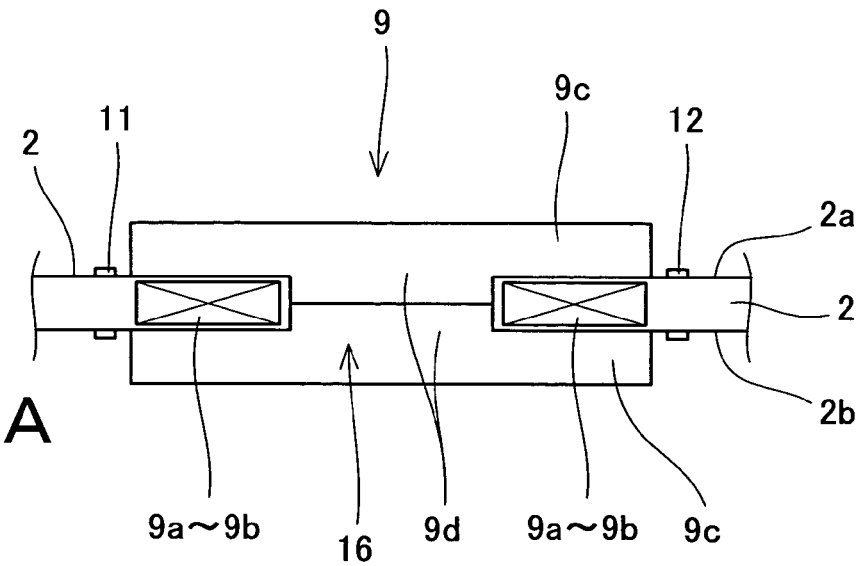
FIG. 3A is a cross-sectional view schematically illustrating a vertical cross-section of a core that constitutes the transformer, taken along X axis.
Figure 3B:
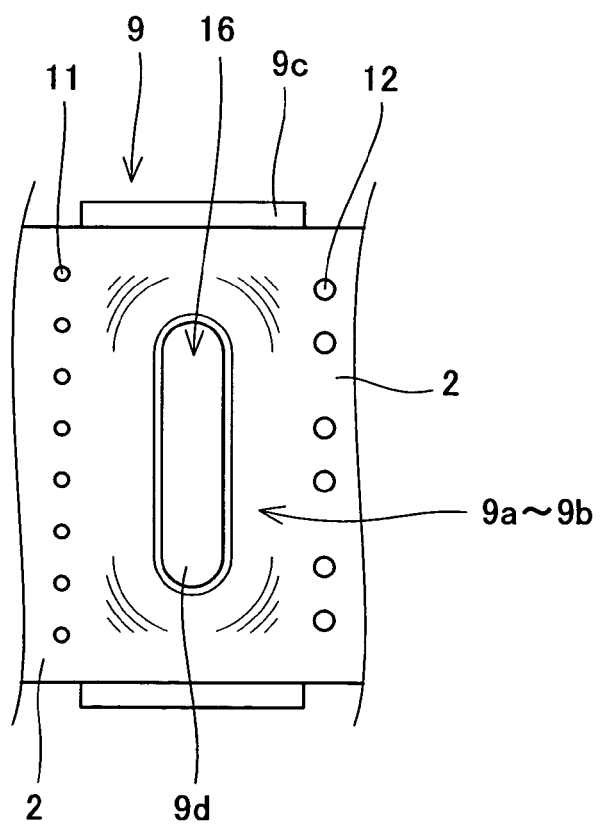
FIG. 3B is a cross-sectional view schematically illustrating a horizontal cross-section of the core that constitutes the transformer, taken along Y axis.

FIG. 1 is an oblique view schematically illustrating the structure of the switching power supply device 100 of the present embodiment. FIG. 2 is a side view schematically illustrating the structure of the switching power supply device 100 illustrated in FIG. 1. FIG. 3 shows cross-sectional views schematically illustrating the internal configuration of the transformer 9 in the switching power supply device 100 illustrated in FIGS. 1 and 2, in which FIG. 3A is a cross-sectional view schematically illustrating a vertical cross-section of the transformer core 9c that constitutes the transformer 9 taken along the X axis, and FIG. 3B is a cross-sectional view schematically illustrating a horizontal cross-section of the transformer core 9c that constitutes the transformer 9 taken along the Y axis. The X axis and the Y axis directions are defined as shown in FIG. 1.

As shown in FIGS. 1 and 2, the switching power supply device 100 of the present embodiment is configured so that a multi-layer printed circuit board 2 having connecting terminals 4a to 4d, the inductance 13, the output smoothing capacitor 7, and the control circuit 17 are arranged at predetermined positions on a main printed circuit board 1 having connecting terminals 5a to 5d.

The multi-layer printed circuit board 2 is composed of a thermosetting resin such as an epoxy resin or a polyimide resin, a glass fabric, and wiring. The wiring, which is a constituting element of the multi-layer printed circuit board 2 but not shown in the figure, is composed of a plurality of wiring lines for electrically connecting a plurality of semiconductor elements or the like arranged on the multi-layer printed circuit board 2 so as to form a predetermined circuit, and a transformer primary winding 9a and a transformer secondary winding 9b, which are for constituting the transformer 9 and will be described below. In the following, the transformer primary winding 9a and the transformer secondary winding 9b are described, which are for constituting the transformer 9.

As shown in FIGS. 1 and 2, the multi-layer printed circuit board 2 is divided into three regions, a primary-side inverter region a, a transformer winding region b, and a secondary-side rectification region c. The transformer primary winding 9a and the transformer secondary winding 9b are formed within the transformer winding region b of the multi-layer printed circuit board 2 in the following manner: spiral-shaped wiring lines formed in respective layers of the multi-layer printed circuit board 2 are stacked each other with electrically insulative members 14 interposed therebetween, and are connected three-dimensionally and electrically via through holes 11 and 12. Here, the internal configuration of the transformer 9 is further described in detail referring to FIG. 3. As shown in FIGS. 3A and 3B, a through hole 16 having a predetermined shape is formed at a predetermined position in the transformer winding region b of the multi-layer printed circuit board 2. In addition, the transformer core 9c composed of such a material as ferrite is arranged so as to surround the multi-layer printed circuit board 2 so that a center leg portion 9d of the transformer core 9c is fitted into the through hole 16. Herein, the center leg portion 9d has a cross-sectional shape such that the shorter sides of a rectangle form an arc-like shape. It should be noted that the cross-sectional shape of the center leg portion 9d is not limited to the just-noted cross-sectional shape, and may be other shapes such as a circular shape, a rectangular shape, and an elliptical shape. Meanwhile, the transformer primary winding 9a and the transformer secondary winding 9b, which are formed as described above, are arranged on the outer periphery of the through hole 16 of the multi-layer printed circuit board 2. The transformer primary winding 9a and the transformer secondary winding 9b are respectively arranged around the through hole 16 in a spiral shape. In addition, respective ends of the transformer primary winding 9a and the transformer secondary winding 9b, specifically, a connecting portion of the transformer primary winding 9a with active elements, passive elements, etc. (hereinafter referred to as a "first connecting portion"), not shown in the drawing, and a connecting portion of the transformer secondary winding 9b with active elements, passive elements, etc. (hereinafter referred to as a "second connecting portion"), also not shown in the drawing, are located to have such an arrangement relationship that they are isolated by the center leg portion 9d interposed therebetween. The transformer primary winding 9a and transformer secondary winding 9b are magnetically coupled by the center leg portion 9d of the transformer core 9c. Consequently, an alternating current corresponding to the voltage applied to the first connecting portion of the transformer primary winding 9a of the transformer 9 is generated in the second connecting portion of the transformer secondary winding 9b of the transformer 9. Thus, the transformer 9 formed on the multi-layer printed circuit board 2 is configured so that the transformer core 9c, the transformer primary winding 9a and transformer secondary winding 9b, and the through holes 11 and 12, etc. are arranged in the above-noted manner and the first connecting portion and the second connecting portion have the above-described arrangement relationship, which is an important feature.

Meanwhile, as shown in FIGS. 1 and 2, the MOSFETs 8a and 8b and the input smoothing capacitors 6a and 6b are mounted on a first major surface 2a and a second major surface 2b of the multi-layer printed circuit board 2 within the primary-side inverter region a. In the primary-side inverter region a, the MOSFETs 8a and 8b, and the input smoothing capacitors 6a and 6b are arranged in the vicinity of a connecting terminal, not particularly shown in the figure, that is drawn out from the transformer primary winding 9a. In addition, the first diode 10a and second diode 10b are mounted on the first major surface 2a and the second major surface 2b of the multi-layer printed circuit board 2 within the secondary-side rectification region c. In the secondary-side rectification region c, these diodes 10a and 10b are arranged in the vicinity of a connecting terminal, not particularly shown in the figure, that is drawn out from the transformer secondary winding 9b. The input smoothing capacitors 6a and 6b, the MOSFETs 8a and 8b, and the transformer primary winding 9a of the transformer 9 are electrically connected by a plurality of wiring lines (not particularly shown in the figure) formed on the multi-layer printed circuit board 2 so as to form a predetermined circuit, and thereby an inverter circuit is formed. Also, the first diode 10a, the second diode 10b, and the transformer secondary winding 9b of the transformer 9 are electrically connected by a plurality of wiring lines (not particularly shown in the figure) formed on the multi-layer printed circuit board 2 so as to form a predetermined circuit, and thereby a rectifier circuit is formed. It should be noted that the connecting terminals 4a and 4b are terminals for connecting the main printed circuit board 1 and the multi-layer printed circuit board 2 in order to apply a direct current to both ends of the input smoothing capacitors 6a and 6b. Likewise, the connecting terminals 4c and 4d are terminals for connecting the main printed circuit board 1 and the multi-layer printed circuit board 2 in order to apply direct current to the later-described smoothing circuit. Also, the transformer 9 is formed on the multi-layer printed circuit board 2, and further the active elements, the passive elements, and the connecting terminals 4a to 4d are arranged in the above-described manner; thus, a power module 18 is configured.

As shown in FIG. 2, the power module 18, the inductance 13, and the output smoothing capacitor 7 are arranged at respective predetermined positions on a first major surface 1a of the main printed circuit board 1. In addition, the control circuit 17 composed of a plurality of active elements and passive elements is formed on a second major surface 1b of the main printed circuit board 1. The inductance 13 and the output smoothing capacitor 7 are electrically connected by a plurality of wiring lines (not particularly shown in the figure) formed on the main printed circuit board 1 so as to form a predetermined circuit, and thereby a smoothing circuit is formed. It should be noted that the connecting terminals 5a and 5b are terminals for connecting an external device with the connecting terminals 4a and 4b in order to apply a direct current thereto. Likewise, the connecting terminals 5c and 5d are connecting terminals for applying a direct current to an external element, etc., such as CPUs.

It should be noted that although the present embodiment describes a switching power supply device that is for outputting a direct current at a relatively low current and uses a forward-type converter circuit, the advantageous effects of the present invention become more apparent by adopting a configuration in which a further plurality of switching elements and rectifier elements are connected in parallel in order to output a direct current at a higher current. In the following, another switching power supply device according to the present embodiment is described, in which both switching elements and rectifier elements are connected in parallel.

Figure 6:
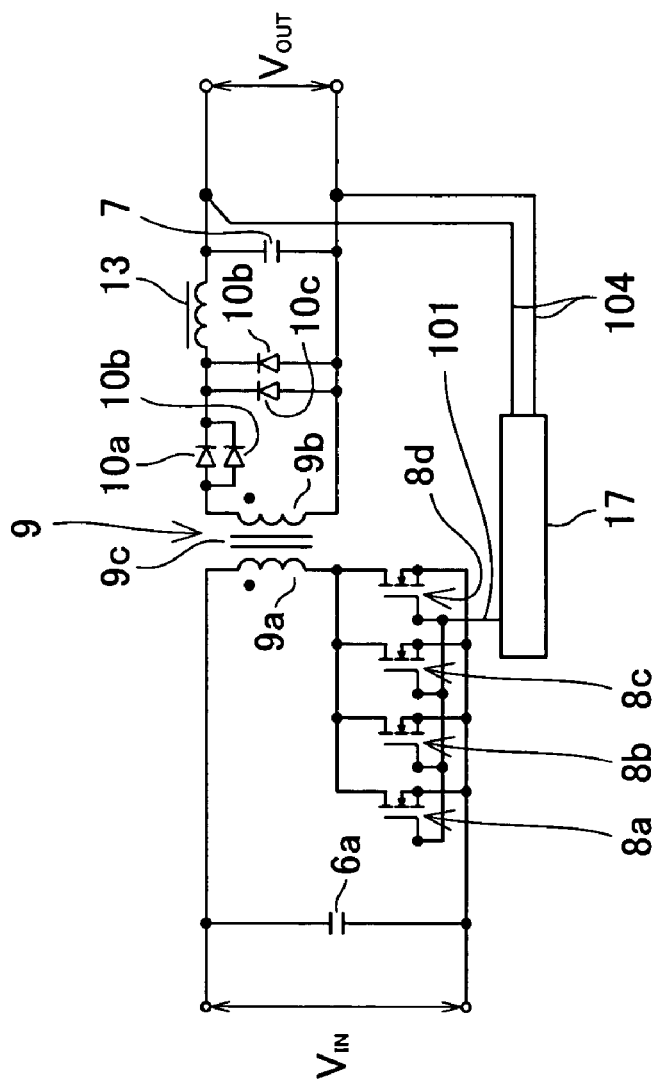
FIG. 6 is a circuit diagram of another switching power supply device according to the first preferred embodiment of the present invention that adopts a forward-type converter circuit.

FIG. 6 is a circuit diagram of another switching power supply device 200 according to the first preferred embodiment of the present invention. As shown in FIG. 6, the other switching power supply device 200 of the present embodiment is configured to include: an input smoothing capacitor 6a; n-channel type MOSFETs 8a to 8d connected in parallel; a transformer 9 including a transformer primary winding 9a, a transformer secondary winding 9b, and a transformer core 9c (the turns ratio being N:1); first diodes 10a and 10b connected in parallel; second diodes 10c and 10d connected in parallel; an inductance 13; an output smoothing capacitor 7; and a control circuit 17. These active elements and passive elements are electrically connected to form a predetermined circuit, and thus the switching power supply device 200 is configured.

The circuit diagram of the other switching power supply device 200 of the present embodiment is explained in detail with reference to FIG. 6. A direct current voltage $V_{IN}$, which is applied from outside, is applied to both terminals of the input smoothing capacitor 6a. One terminal of the input smoothing capacitor 6a is connected to one of the terminals of the transformer primary winding 9a of the transformer 9, and further, the other terminal of the input smoothing capacitor 6a is connected to each of the source terminals of the MOSFETs 8a to 8d. The other terminal of the transformer primary winding 9a of the transformer 9 is connected to each of the drain terminals of the MOSFETs 8a to 8d. The gate terminals of the MOSFETs 8a to 8d are connected to the control circuit 17 by a wiring line 101.

The transformer secondary winding 9b of the transformer 9 is magnetically connected to the transformer primary winding 9a by the transformer core 9c. Consequently, an alternating current corresponding to the change in the voltage applied to the transformer primary winding 9a is generated in the transformer secondary winding 9b. One of the terminals of the transformer secondary winding 9b of the transformer 9 is connected to the anode terminals of the first diodes 10a and 10b. The other terminal of the transformer secondary winding 9b of the transformer 9 is connected to the anode terminals of the second diodes 10c and 10d. The cathode terminals of the first diodes 10a and 10b and the cathode terminals of the second diodes 10c and 10d are connected to each other, and they are further connected to one terminal (input side) of the inductance 13. The other terminal (output side) of the inductance 13 is connected to one of the terminals of the output smoothing capacitor 7, and the other terminal of the output smoothing capacitor 7 is connected to the anode terminals of the second diodes 10c and 10d. A direct current voltage $V_{OUT}$ is output from both ends of the output smoothing capacitor 7.

Figure 5:
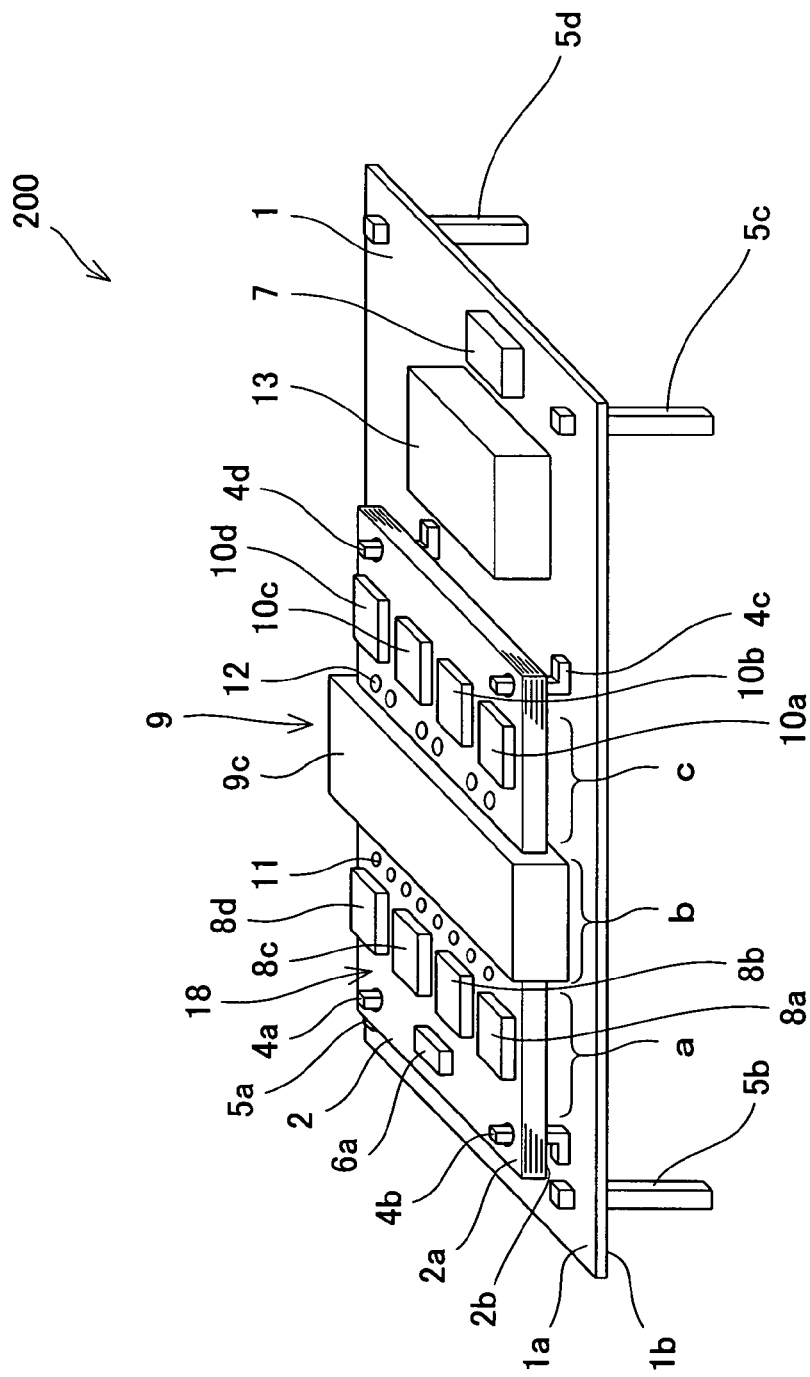
FIG. 5 is an oblique view schematically illustrating the structure of another switching power supply device according to the first preferred embodiment of the present invention.

FIG. 5 is an oblique view schematically illustrating the structure of the other switching power supply device 200 according to the present embodiment.

As shown in FIG. 5, the other switching power supply device 200 according to the present embodiment is configured so that a multi-layer printed circuit board 2 having connecting terminals 4a to 4d; an inductance 13; an output smoothing capacitor 7; a control circuit 17, which is not shown in FIG. 5, are arranged at predetermined positions on a main printed circuit board 1 having connecting terminals 5a to 5d. In the sense that it is configured in this manner, the switching power supply device 200 has the same configuration as that of the switching power supply device 100 that has been described in the present embodiment. Nevertheless, as shown in FIG. 6, in the other switching power supply device 200 of the present embodiment, the MOSFETs 8a to 8d, the first diodes 10a and 10b, and the second diodes 10c and 10d are connected in parallel. Thus, the switching power supply device 200 shown in FIG. 5 differs from the switching power supply device 100 described in the present embodiment in that four MOSFETs 8a to 8d and four diodes 10a to 10d are mounted on the multi-layer printed circuit board 2. It should be noted that the rest of the configuration is similar to the switching power supply device 100 in the present embodiment and therefore is not further elaborated upon.

Next, the operations of the switching power supply device 100 and the switching power supply device 200 configured in such a manner will be discussed. The switching power supply device 100 and the other switching power supply device 200 described in the present embodiment only differ in whether or not the switching elements and the rectifier elements are connected in parallel, and the basic operations of the switching power supply device 100 and the switching power supply device 200 are identical. For this reason, the operation of the switching power supply device 100 according to the present embodiment will be discussed in the following.

When a direct current is applied to the connecting terminals 5*a* and 5*b* provided on the main printed circuit board 1, the direct current passes through wiring formed on the main printed circuit board 1, which is not particularly shown in the figure, and the connecting terminals 4*a* and 4*b* and is applied to both ends of the input smoothing capacitors 6*a* and 6*b*. Then, by the MOSFETs 8*a* and 8*b* performing a switching operation in response to a turn-on signal that is output from the control circuit 17, a pulsed voltage is applied to the transformer primary winding 9*a* of the transformer 9. At that time, an alternating current corresponding to the change of the pulsed voltage applied to the transformer primary winding 9*a* is induced in the transformer secondary winding 9*b* of the transformer 9. The alternating current generated at both ends of the transformer secondary winding 9*b* of the transformer 9 is rectified by the first and second diodes 10*a* and 10*b* and is thus converted into a direct current. Then, the direct current passes through the connecting terminals 4*c* and 4*d* provided on the multi-layer printed circuit board 2 and the wiring formed on the main printed circuit board 1, which is not particularly shown in the figure, and is applied to the smoothing circuit composed of the inductance 13 and the output smoothing capacitor 7. The reason is that the direct current obtained by the rectification with the first and second diodes 10*a* and 10*b* contains a ripple (alternating current component), and the ripple needs to be suppressed. The direct current in which the ripple is suppressed in this way by the smoothing circuit is output from the connecting terminals 5*c* and 5*d* provided on the main printed circuit board 1 to the outside of the switching power supply device 100. The output voltage at both ends of the output smoothing capacitor 7 is constantly monitored by the control circuit 17, and the control circuit 17 controls the on-off ratio of the switching operation of the MOSFETs 8*a* and 8*b* by varying the turn-on signal in order to stabilize the output voltage. Since the control circuit 17 operates in the above-described manner, the output voltage of the direct current that is output from the switching power supply device 100 is stabilized.

Here, in the present embodiment, the multi-layer printed circuit board 2 is equipped with the inverter circuit and the rectifier circuit and is arranged on the first major surface 1*a* of the main printed circuit board 1. On the other hand, the control circuit 17 is arranged on the second major surface 1*b* of the main printed circuit board 1. This makes it possible to attain the following advantageous effect: since it becomes possible to optimize the use of minute wiring lines that are required for the control circuit 17 and non-minute wiring lines that are required for the power section, the package density of circuit elements and the like improves dramatically and a size reduction of the switching power supply device 100 becomes possible. Specifically, it is possible to achieve about 30% size reduction in volume ratio. Moreover, it becomes possible to shorten the wiring lines through which a high-frequency switching current flows at a high current, and, for example, it is possible to substantially eliminate the parasitic inductance occurring in the wiring line between the transformer secondary winding 9*b* of the transformer 9 and the diodes 10*a* and 10*b*. Furthermore, even when the switching frequency of the switching power supply device 100 is raised higher than that in conventional devices, adverse effects such as skin effect or the like can be suppressed. Still further, it becomes possible to suppress the surge voltage at the turning-off of the transformer primary winding 9*a* and the transformer secondary winding 9*b*. Another possible advantageous effect is that the control circuit 17 is not easily affected by noise because the current path of low current that flows through the control circuit can be physically isolated from the current path through which a high-frequency switching current flows at a high current. More specifically, when, for example, the output voltage of the switching power supply device 100 needs to be lowered, a more stable direct current output voltage can be obtained due to the just-noted noise reduction effect. Further, when the output current from the switching power supply device 100 needs to be elevated, power loss can be reduced by the shortened wiring length of the wiring pattern between various elements. Further another possible advantageous effect is that when the output voltage of the switching power supply device 100 needs to be changed into a different voltage, it can be achieved by merely replacing the power module 18; therefore, manufacturability of the switching power supply device 100 improves, and cost reduction will result. Still another possible advantageous effect is that it is possible to avoid the problems associated with the parasitic inductance resulting from the connection between the power module 18 and the main printed circuit board 1 because the current transmitted between the power module 18 and the main printed circuit board 1 is practically direct current.

It should be noted that the present embodiment has described illustrative examples of switching power supply devices 100 and 200 that use the MOSFETs 8*a* to 8*d* as the switching elements, but it is possible to use bipolar transistors, insulated gate bipolar transistors (hereinafter abbreviated as "IGBT"), or the like, in place of the MOSFETs 8*a* to 8*d*. In addition, although the present embodiment has described examples in which the multi-layer printed circuit board 2 and the main printed circuit board 1 employ a thermosetting resin and a glass fabric, it is also possible to employ a configuration that employs a thermosetting resin and an inorganic filler.

Figure 7:
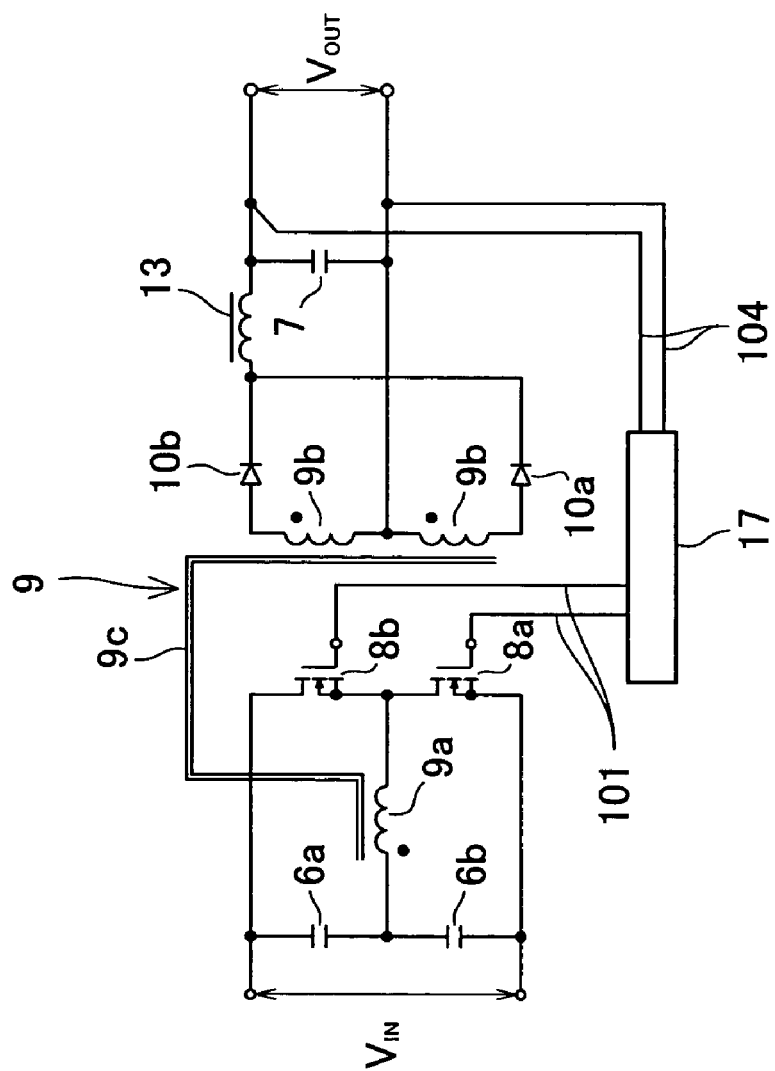
FIG. 7 is a circuit diagram of a switching power supply device according to the first preferred embodiment of the present invention that adopts a half-bridge type converter circuit.

In addition, although the present embodiment has described example that uses a forward-type converter circuit as its main circuit, it is also possible to employ a configuration that uses a half-bridge type converter circuit as illustrated in FIG. 7. By adopting such a configuration, the advantage can be obtained that very little surge voltage occurs even when a high current flows through the transformer primary winding 9*a* because the leakage inductance between the transformer primary winding 9*a* and the transformer secondary winding 9*b* of the transformer 9 is reduced. In this case, an additional advantage is obtained that the number of windings of the transformer primary winding 9*a* can be reduced. It should be noted that the converter circuit is not limited to the forward-type converter circuit and the half-bridge type converter circuit and other converter circuits may be used.

Figure 8:
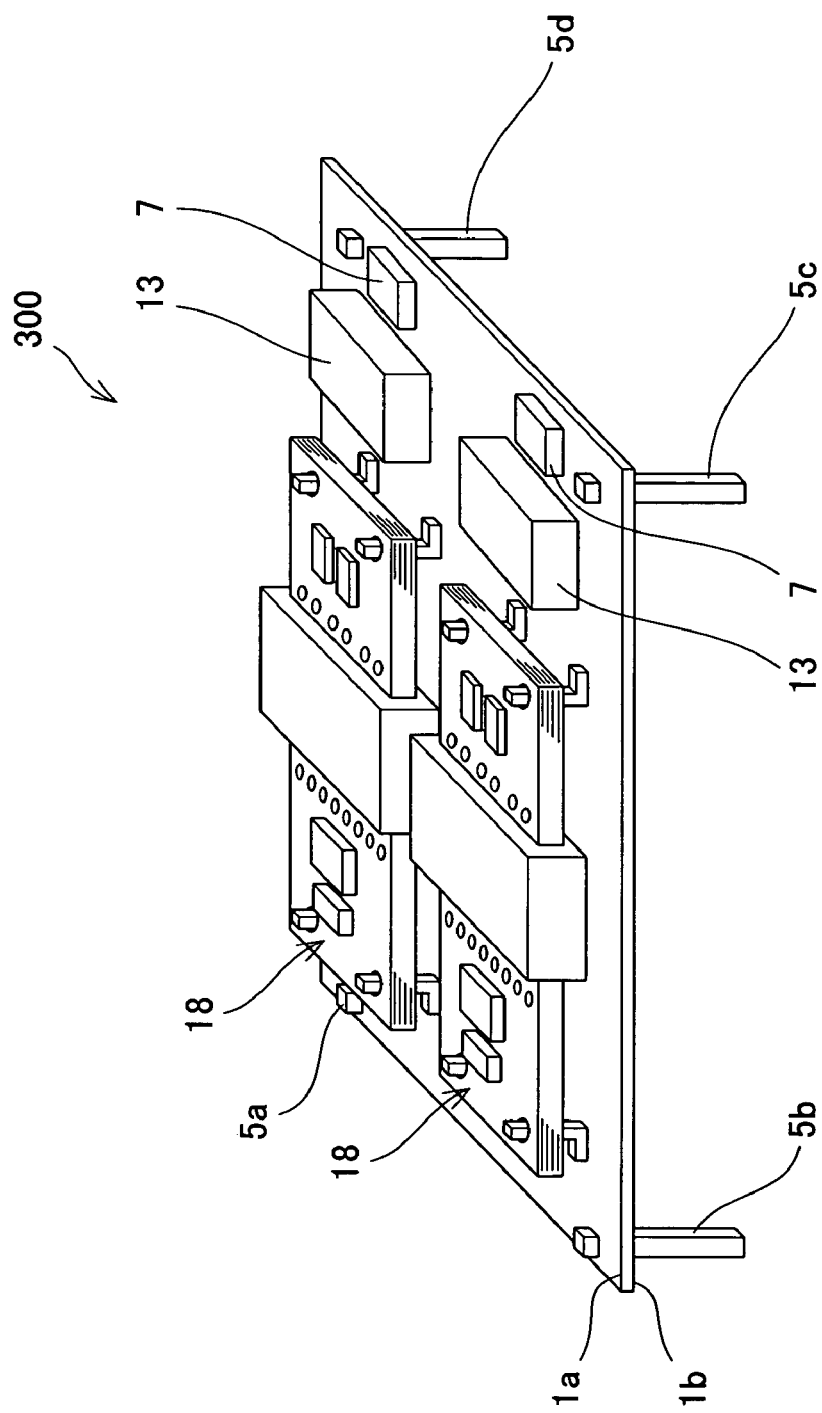
FIG. 8 is an oblique view schematically illustrating the structure of a switching power supply device according to the first preferred embodiment of the present invention that is provided with two sets of power modules and smoothing circuits.

Furthermore, although the present embodiment employs a configuration in which a set of power module 18 and smoothing circuit is arranged on a single main printed circuit board 1, it is possible to employ a configuration of a switching power supply device 300 as illustrated in FIG. 8, in which two sets of power modules 18 and smoothing circuits are provided on a single main printed circuit board 1. Alternatively, although not particularly shown in the drawings, it is possible to employ a configuration in which two sets of power modules 18 are integrated into a single component and arranged, as a set of power module, on a main printed circuit board 1. In other words, the advantageous effects of the present invention can be obtained equally in various embodiments, irrespective of the number of power modules 18 mounted on the main printed circuit board 1 or the number of circuits formed thereon.

On the other hand, in the present embodiment, by increasing the switching speed of the MOSFETs 8a and 8b, it is possible to reduce the power loss (switching loss) that occurs in switching operations. In this case, in order to increase the switching speed of the MOSFETs 8a and 8b, it is necessary to reduce the parasitic inductance that exists in the wiring lines that electrically connect the MOSFETs 8a and 8b to a driver unit for enabling the MOSFETs 8a and 8b to perform switching operations. That is, by reducing the parasitic inductance, it becomes possible to reduce the current suppressing effect due to the wiring lines, and therefore, it becomes possible to achieve high-speed switching operations and reduce the switching loss.

In the following, an embodiment of a switching power supply device that has a suitable configuration for reducing switching loss is discussed.

Figure 9A:
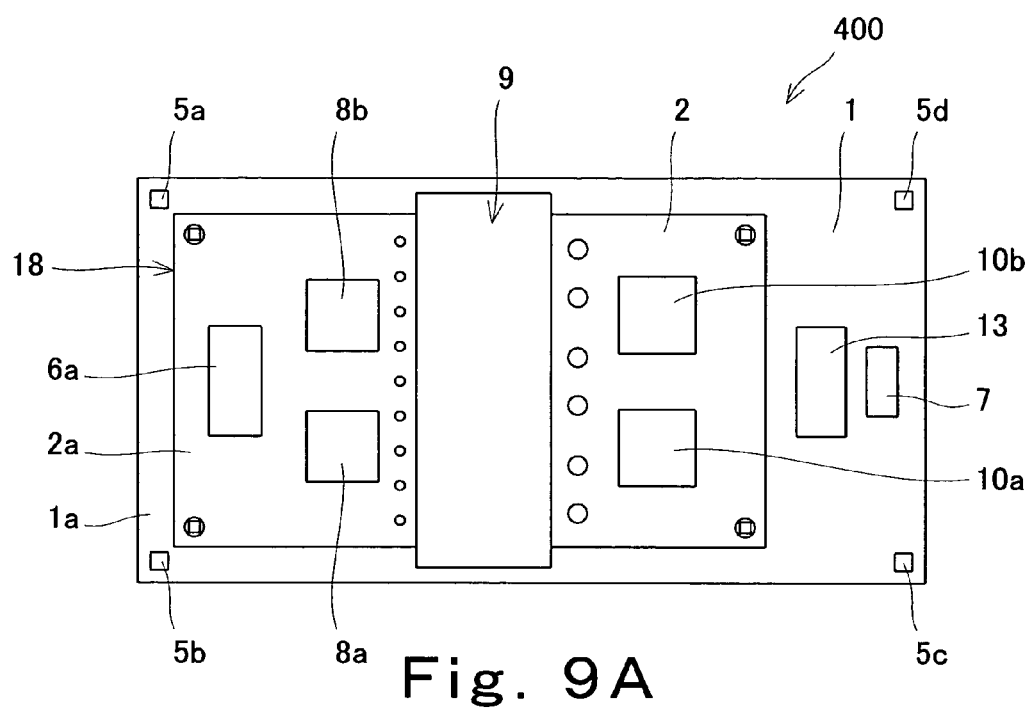
FIG. 9A is a top view thereof.
Figure 9B:
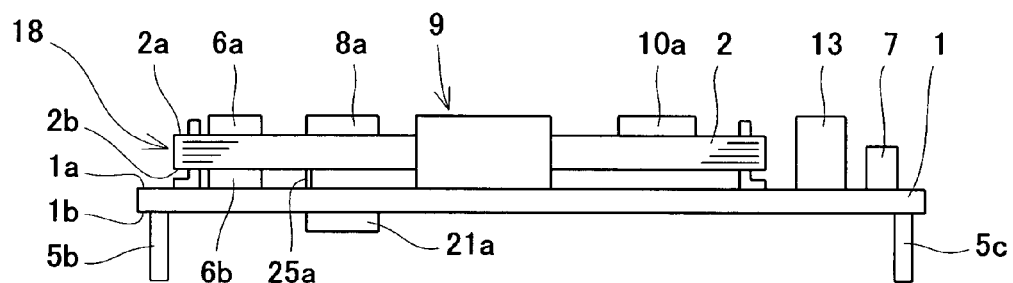
FIG. 9B is a side view thereof.
Figure 9C:
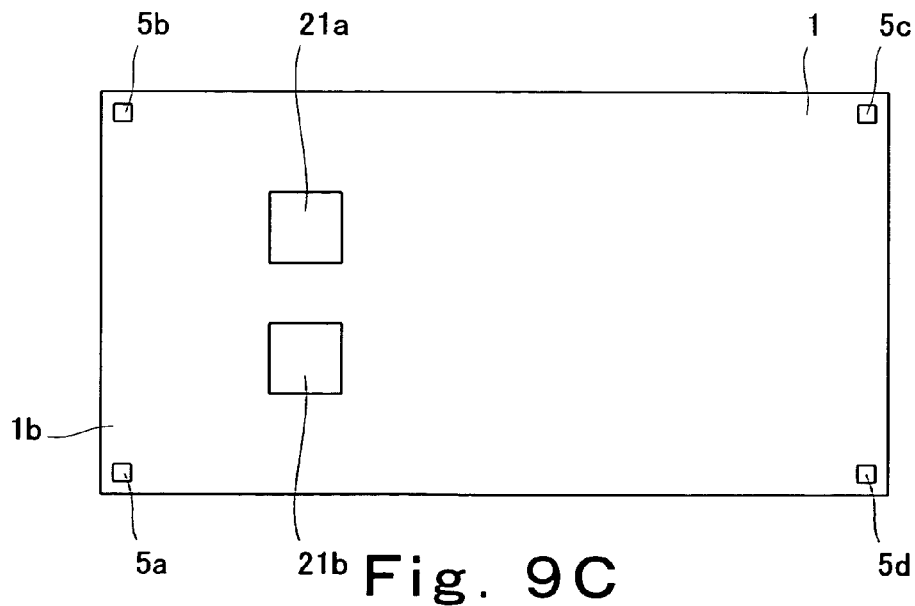
FIG. 9C is a bottom view thereof.

FIG. 9 shows configuration diagrams schematically illustrating a switching power supply device according to the present embodiment in which a driver unit is arranged in the vicinity of the switching circuit; FIG. 9A is a top view thereof, FIG. 9B is a side view thereof, and FIG. 9C is a bottom view thereof.

As shown in FIGS. 9A and 9B, a switching power supply device 400 according to the present embodiment is configured to comprise a multi-layer printed circuit board 2, an inductance 13, an output smoothing capacitor 7, and a control circuit, not shown in FIG. 9B, all of which are arranged at predetermined positions on a main printed circuit board 1 having connecting terminals 5a to 5d. The multi-layer printed circuit board 2 has input smoothing capacitors 6a and 6b, MOSFETs 8a and 8b, a transformer 9, and diodes 10a and 10b. That is, the switching power supply device 400 according to the present embodiment has a similar circuit configuration to that shown in FIG. 4, but has such a configuration in which the MOSFET 8b and the diode 10b shown in FIG. 2 are arranged on the first major surface 2a of the multi-layer printed circuit board 2. In addition, as shown in FIGS. 9B and 9C, in the switching power supply device 400 according to the present embodiment, driver units 21a and 21b for enabling the MOSFETs 8a and 8b to perform switching operations are arranged on the second major surface 1b of the main printed circuit board 1 at the positions that oppose the MOSFETs 8a and 8b across the thickness of the multi-layer printed circuit board 2. In other words, the driver units 21a and 21b are arranged on the second major surface 1b of the main printed circuit board 1 at the positions that are substantially at the shortest distance from the MOSFETs 8a and 8b. Further, in the embodiment shown in FIGS. 9A to 9C, the MOSFETs 8a and 8b and the driver units 21a and 21b are electrically connected to each other by a wiring line 25a made of a lead wire or the like via a through hole (not shown) in the main printed circuit board 1 and a through hole (not shown) in the multi-layer printed circuit board 2. That is, the MOSFETs 8a and 8b and the driver units 21a and 21b are connected by a wiring line that connects them substantially in the shortest distance. In this respect, the configuration of the switching power supply device 400 differs from that of the switching power supply device 100 described in the present embodiment. The rest of the configuration is similar to that of the switching power supply device 100 in the present embodiment and is therefore not further elaborated upon here.

In the present embodiment, the driver units 21a and 21b are configured within the control circuit 17 shown in FIG. 2.

Figure 10:
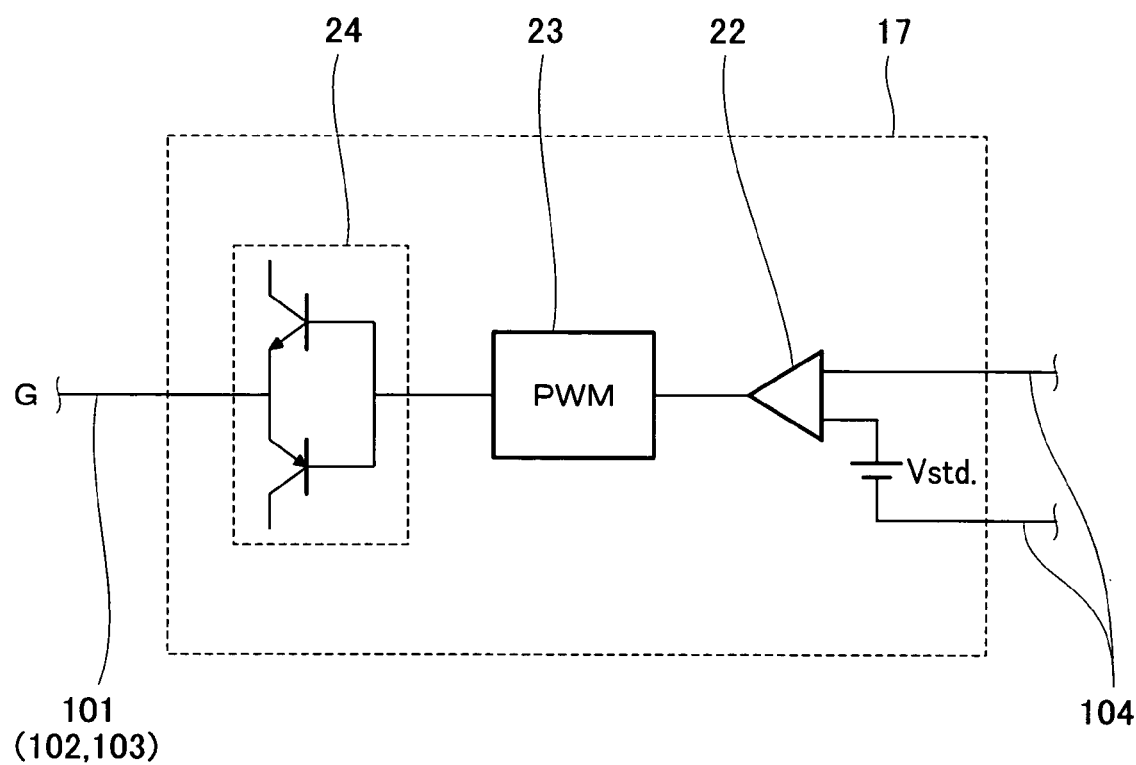
FIG. 10 is a block diagram schematically illustrating the configuration of the control circuit in the switching power supply device shown in FIG. 9.

FIG. 10 is a block diagram schematically illustrating the internal configuration of the control circuit in the switching power supply device shown in FIG. 9.

As shown in FIG. 10, the control circuit 17 provided in the switching power supply device 400 according to the present embodiment is equipped with an error amplifier 22 for amplifying the voltage difference between a reference voltage $V_{std.}$ and an output voltage $V_{OUT}$, a PWM signal-generating section 23 for outputting a PWM signal in response to the output signal that is output from the error amplifier 22, and a driver unit 24 (which corresponds to the driver units 21a and 21b in FIG. 9) for outputting a gate signal for enabling the MOSFETs 8a and 8b to perform switching operations in response to an output signal that is output from the PWM signal-generating section 23. Here, the driver unit 24 has a configuration in which a NPN-type transistor and a PNP-type transistor are connected in a push-pull configuration. Wiring lines 104, which are to be connected to both terminals of the output smoothing capacitor 7 shown in FIG. 4, are connected to input terminals of the error amplifier 22. In this case, the reference voltage $V_{std.}$ is further applied to one of the terminals of the error amplifier 22. In addition, the error amplifier 22 and the PWM signal-generating section 23 are connected to each other, and the PWM signal-generating section 23 and the driver unit 24 (the base terminal of each of the transistors in the driver unit 24) are connected to each other. Also, the driver unit 24 (the emitter terminal in each of the transistors in the driver unit 24) and the gate terminals of the MOSFETs 8a and 8b are connected by the wiring line 101.

With the control circuit 17 configured as shown in FIG. 10, when the output voltage applied from the switching power supply device 400 via the wiring lines 104 is applied to the error amplifier 22, the error amplifier 22 amplifies the voltage difference between the applied voltage and the reference voltage $V_{std.}$ and outputs it as an error signal. Then, the PWM signal-generating section 23 outputs a PWM signal the duty ratio of which has been controlled according to the input error signal. The driver unit 24 amplifies the PWM signal output from the PWM signal-generating section 23 by a predetermined amplification factor. The amplified PWM signal is applied to the gate terminals of the MOSFETs 8a and 8b via the wiring line 101. Accordingly, the MOSFETs 8a and 8b perform a switching operation in order to stabilize the output voltage from the switching power supply device 400.

Figure 19A:
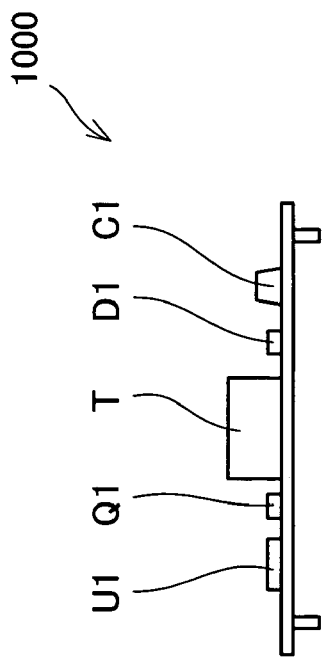
FIG. 19A is a side view thereof and FIG. 19B is a top view thereof.
Figure 19B:
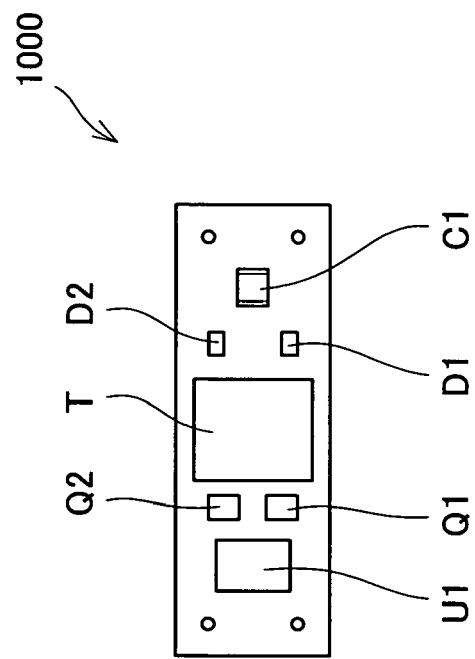

In the switching power supply device 400 having such a configuration, the MOSFETs 8a and 8b and the driver units 21a and 21b are arranged so that they are at the shortest distance; moreover, the MOSFETs 8a and 8b and the driver units 21a and 21b are connected by a wiring line that connects them in the shortest distance. Therefore, it becomes possible to reduce the parasitic inductance that exists in the wiring lines for electrically connecting the MOSFETs 8a and 8b and the driver units 21a and 21b. In addition, this makes it possible to reduce the current suppressing effect in the wiring lines, and consequently, the MOSFETs 8a and 8b can perform a high-speed switching operation, making it possible to reduce the switching loss in the switching elements in comparison with the case of the conventional switching power supply device 1000 shown in FIG. 19, in which the electronic components and the like are arranged two-dimensionally.

Second Preferred Embodiment

Figure 11:
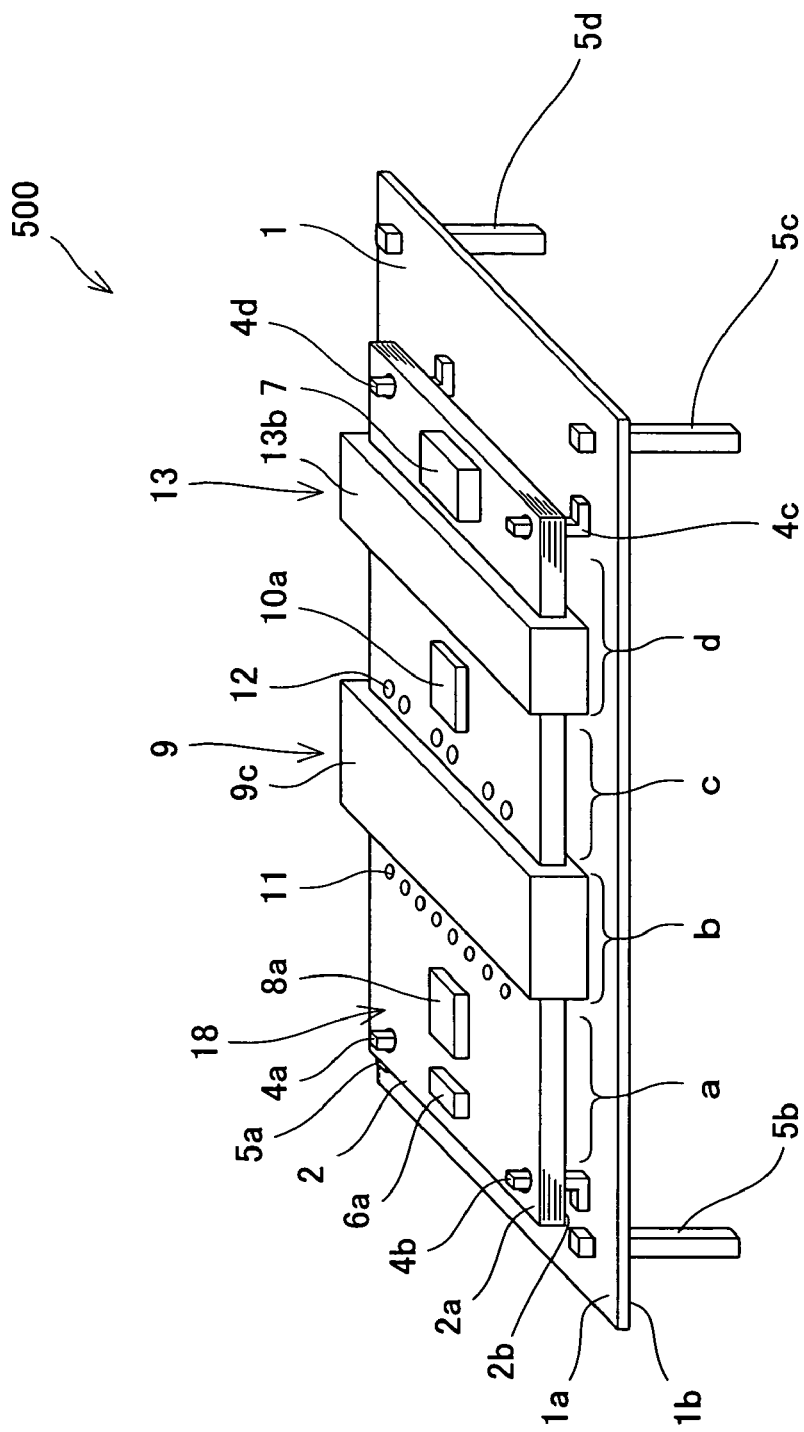
FIG. 11 is an oblique view schematically illustrating the structure of a switching power supply device according to a second preferred embodiment of the present invention.
Figure 12:
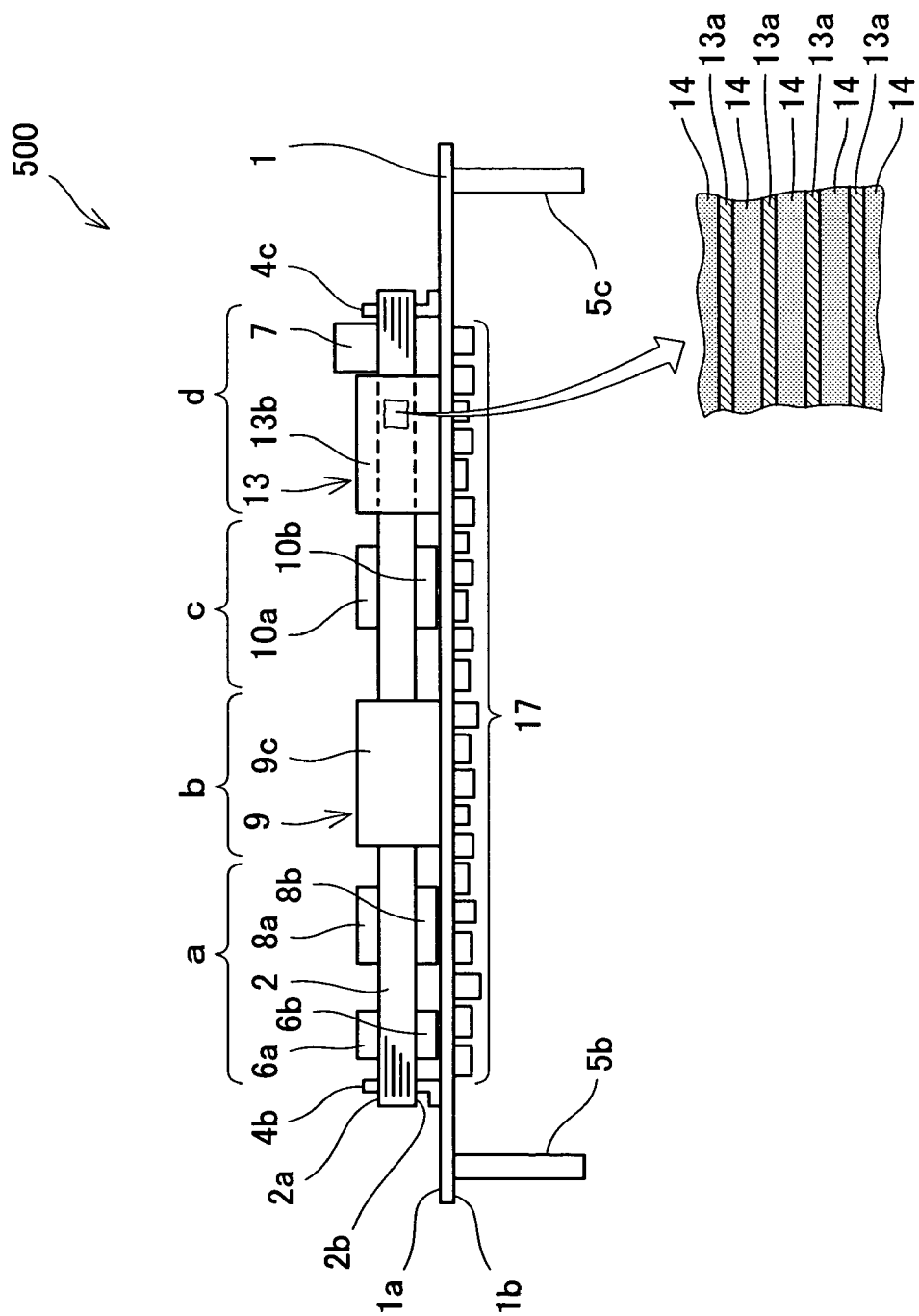
FIG. 12 is a side view schematically illustrating the configuration of the switching power supply device shown in FIG. 11.

FIG. 11 is an oblique view schematically illustrating the structure of a switching power supply device 500 according to a second preferred embodiment of the present invention. FIG. 12 is a side view schematically illustrating the structure of the switching power supply device 500 shown in FIG. 11.

The circuit diagram of the switching power supply device 500 described in the present embodiment is identical to the circuit diagram of the switching power supply device 100 that has been described in the first preferred embodiment. Therefore, the description concerning the circuit diagram and operation of the switching power supply device 500 of the present embodiment will be omitted here. However, the configuration of the switching power supply device 500 of the present embodiment differs from that of the switching power supply device 100 of the first preferred embodiment in the shape and arrangement position of the inductance 13 and the arrangement position of the output smoothing capacitor 7. For this reason, the structure of the switching power supply device 500 is described below while making comparison with the switching power supply device 100 described in the first preferred embodiment.

As shown in FIGS. 11 and 12, the switching power supply device 500 of the present embodiment is configured to comprise: a multi-layer printed circuit board 2 having connecting terminals 4a to 4d, and a control circuit 17, both of which are arranged at predetermined positions on a main printed circuit board 1 having connecting terminals 5a to 5d. An inductance 13 is formed on the multi-layer printed circuit board 2. An output smoothing capacitor 7 is arranged at a predetermined position on the multi-layer printed circuit board 2.

The multi-layer printed circuit board 2 is divided into four regions: a primary-side inverter region a, a transformer winding region b, a secondary-side rectification region c, and a secondary-side smoothing region d. An inductance winding 13a that constitutes the inductance 13 is formed within the secondary-side smoothing region d of the multi-layer printed circuit board 2. The inductance winding 13a is configured by stacking spiral-shaped wiring lines formed in respective layers of the multi-layer printed circuit board 2 with an electrically insulative member 14 interposed therebetween and three-dimensionally, and electrically connecting the wiring lines via a through hole, which is not particularly shown in the figure. An inductance core 13b composed of such a material as ferrite is arranged on the multi-layer printed circuit board 2 in a similar manner to the case of the transformer 9 described in the first preferred embodiment, and thus, the inductance 13 is formed.

MOSFETs 8a and 8b and input smoothing capacitors 6a and 6b are mounted on a first major surface 2a and a second major surface 2b of the multi-layer printed circuit board 2 within the primary-side inverter region a. In the primary-side inverter region a, the MOSFETs 8a and 8b, and the input smoothing capacitors 6a and 6b are arranged in the vicinity of a connecting terminal, not particularly shown in the figure, that is drawn out from the transformer primary winding 9a. A first diode 10a and a second diode 10b are mounted on the first major surface 2a and the second major surface 2b of the multi-layer printed circuit board 2 within the secondary-side rectification region c. In the secondary-side rectification region c, these diodes 10a and 10b are arranged in the vicinity of a connecting terminal, not particularly shown in the figure, that is drawn out from the transformer secondary winding 9b. In addition, the inductance 13 and the output smoothing capacitor 7 are arranged on the first major surface 2a of the multi-layer printed circuit board 2 within the secondary-side smoothing region d. The input smoothing capacitors 6a and 6b, the MOSFETs 8a and 8b, and the transformer primary winding 9a of the transformer 9 are electrically connected by a plurality of wiring lines (not particularly shown in the figure) formed on the multi-layer printed circuit board 2 to form a predetermined circuit, and thereby an inverter circuit is formed. Also, the first and second diodes 10a and 10b and the transformer secondary winding 9b of the transformer 9 are electrically connected by a plurality of wiring lines (not particularly shown in the figure) formed on the multi-layer printed circuit board 2 to form a predetermined circuit, and thereby a rectifier circuit is configured. Further, the inductance 13 and the output smoothing capacitor 7 are electrically connected by a plurality of wiring lines (not particularly shown in the figure) formed on the multi-layer printed circuit board 2 to form a predetermined circuit, and thereby a smoothing circuit is configured. It should be noted that the connecting terminals 4a and 4b are terminals for connecting the main printed circuit board 1 and the multi-layer printed circuit board 2 in order to apply direct current to both ends of the input smoothing capacitors 6a and 6b. Likewise, the connecting terminals 4c and 4d are terminals for connecting the main printed circuit board 1 and the multi-layer printed circuit board 2 in order to apply the output from the output smoothing capacitor 7 to the connecting terminals 5c and 5d of the main printed circuit board. Further, the transformer 9 and the inductance 13 are formed on the multi-layer printed circuit board 2, and the active elements, the passive elements, and the connecting terminals 4a to 4d are arranged in the above-described manner; thus, a power module 18 is configured.

As shown in FIG. 12, the power module 18 is arranged on the first major surface 1a of the main printed circuit board 1. In addition, the control circuit 17, composed of pluralities of active elements and passive elements, is formed on the second major surface 1b of the main printed circuit board 1. It should be noted that the connecting terminals 5a an 5b are terminals for connecting an external device with the connecting terminals 4a and 4b in order to apply a direct current thereto. Also, the connecting terminals 5c and 5d are terminals for applying a direct current to an external element, such as a CPU.

The switching power supply device 500 thus configured also operates in a similar manner to the switching power supply device 100 described in first preferred embodiment, and is also capable of obtaining similar advantageous effects. In other respects, the present embodiment is similar to the first preferred embodiment.

Third Preferred Embodiment

Figure 13:
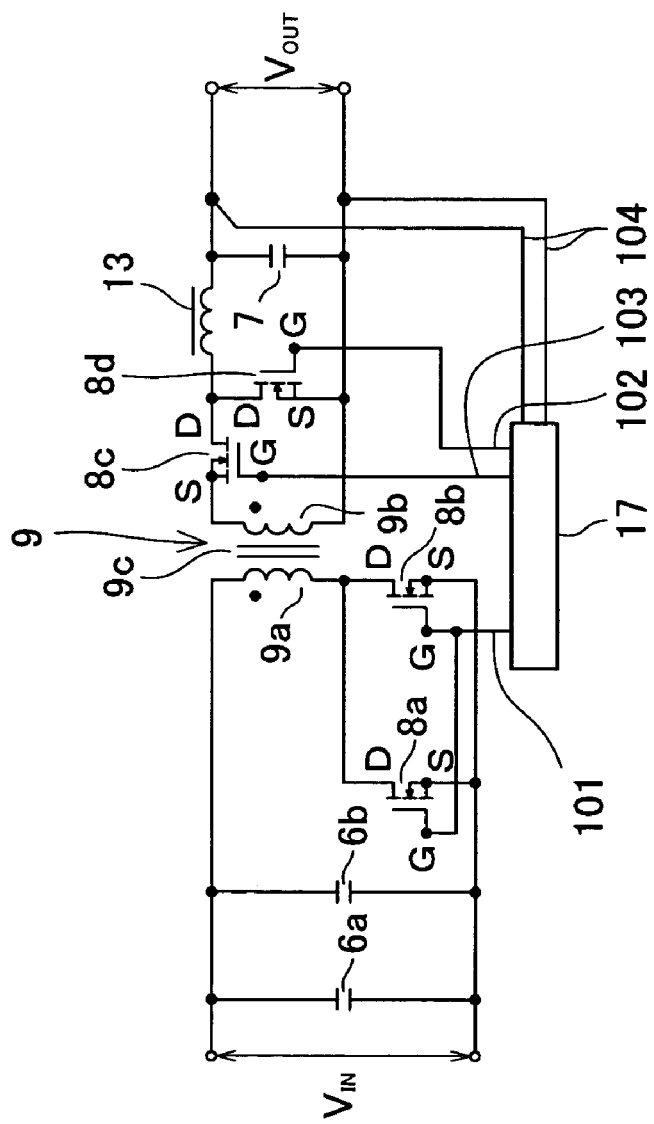
FIG. 13 is a circuit diagram of a switching power supply device according to a third preferred embodiment of the present invention that adopts a forward-type converter circuit.

FIG. 13 is a circuit diagram of a switching power supply device according to a third preferred embodiment of the present invention. As shown in FIG. 13, the switching power supply device described in the present embodiment is configured to comprise: input smoothing capacitors 6a and 6b; n-channel type MOSFETs 8a and 8b; a transformer 9 including a transformer primary winding 9a, a transformer secondary winding 9b, and a transformer core 9c (the turns ratio being N:1); a MOSFET 8c serving as a first rectifier element; a MOSFET 8d serving as a second rectifier element; an inductance 13; an output smoothing capacitor 7; and a control circuit 17. These active elements, passive elements, and the like are electrically connected to form a predetermined circuit, and thereby the switching power supply device is configured.

The circuit diagram of the switching power supply device described in the present embodiment is further detailed with reference to FIG. 13. A direct current voltage $V_{IN}$, which is applied from outside, is applied to both terminals of the input smoothing capacitors 6a and 6b. One of the terminals of each of the input smoothing capacitors 6a and 6b are connected to one of the terminals of the transformer primary winding 9a of the transformer 9, and further, the other one of the terminals of each of the input smoothing capacitors 6a and 6b are connected to each of the source terminals of the MOSFETs 8a and 8b. The other terminal of the transformer primary winding 9a of the transformer 9 is connected to the drain terminals of the MOSFETs 8a and 8b. The gate terminals of the MOSFETs 8a and 8b are connected to the control circuit 17 by a wiring line 101.

The transformer secondary winding 9b of the transformer 9 is magnetically connected to the transformer primary winding 9a by the transformer core 9c. Consequently, an alternating current corresponding to the change in the voltage applied to the transformer primary winding 9a is generated in the transformer secondary winding 9b. One of the terminals of the transformer secondary winding 9b of the transformer 9 is connected to the source terminal of the MOSFET 8c. The other terminal of the transformer secondary winding 9b of the transformer 9 is connected to the source terminal of the MOSFET 8d. The drain terminals of the MOSFETs 8c and 8d are connected to each other and further connected to one terminal (input side) of the inductance 13. The other terminal (output side) of the inductance 13 is connected to one of the terminals of the output smoothing capacitor 7, and the other terminal of the output smoothing capacitor 7 is connected to the source terminal of the MOSFET 8d. A direct current voltage $V_{OUT}$ is output from both ends of the output smoothing capacitor 7. It should be noted that the gate terminals of the MOSFET 8c and MOSFET 8d are connected to the control circuit 17 by a wiring line 102 and a wiring line 103, respectively.

The configuration of the switching power supply device according to the present embodiment is different from that of the switching power supply device 100 described in the first preferred embodiment in that the diodes 10a and 10b are replaced with the MOSFETs 8c and 8d. However, the switching power supply device described in the present embodiment is substantially the same as the switching power supply device 100 that has been described in the first preferred embodiment in terms of their appearance. For this reason, the description concerning the structure of the switching power supply device according to the present embodiment will be omitted. Nevertheless, the switching power supply device 100 described in the first preferred embodiment and the switching power supply device described in the present embodiment greatly differ in their operations. Therefore, in the following, the operation of the switching power supply device described in the present embodiment is described while making comparison with the switching power supply device 100 that has been described in the first preferred embodiment.

The direct current applied to both ends of the input smoothing capacitors 6a and 6b is interrupted by a switching operation performed by the MOSFETs 8a and 8b in response to the turn-on signal that is output from the control circuit 17. As a result, a pulsed voltage is applied to the transformer primary winding 9a of the transformer 9. At that time, an alternating current corresponding to the change of the pulsed voltage applied to the transformer primary winding 9a is induced in the transformer secondary winding 9b of the transformer 9. The alternating current generated at both ends of the transformer secondary winding 9b of the transformer 9 is rectified into a direct current containing a ripple by the MOSFETs 8c and 8d serving as rectifier elements. Then, the ripple is removed by the a smoothing circuit composed of the inductance 13 and the output smoothing capacitor 7, and is output as a voltage $V_{OUT}$ from the switching power supply device. The output voltage from both ends of the output smoothing capacitor 7 is constantly monitored by the control circuit 17, and the control circuit 17 controls the on-off ratio of the switching operation of the MOSFETs 8a and 8b by varying the turn-on signal in order to stabilize the output voltage. The turn-on signal is also applied to the gate terminals of the MOSFETs 8c and 8d with the same phase. Consequently, the MOSFETs 8c and 8d will perform a rectified operation in response to the turn-on signal (commonly called "synchronous rectification"). Since the control circuit 17 operates in the above-described manner, the direct current voltage that is output from the switching power supply device 100 is stabilized.

Figure 14:
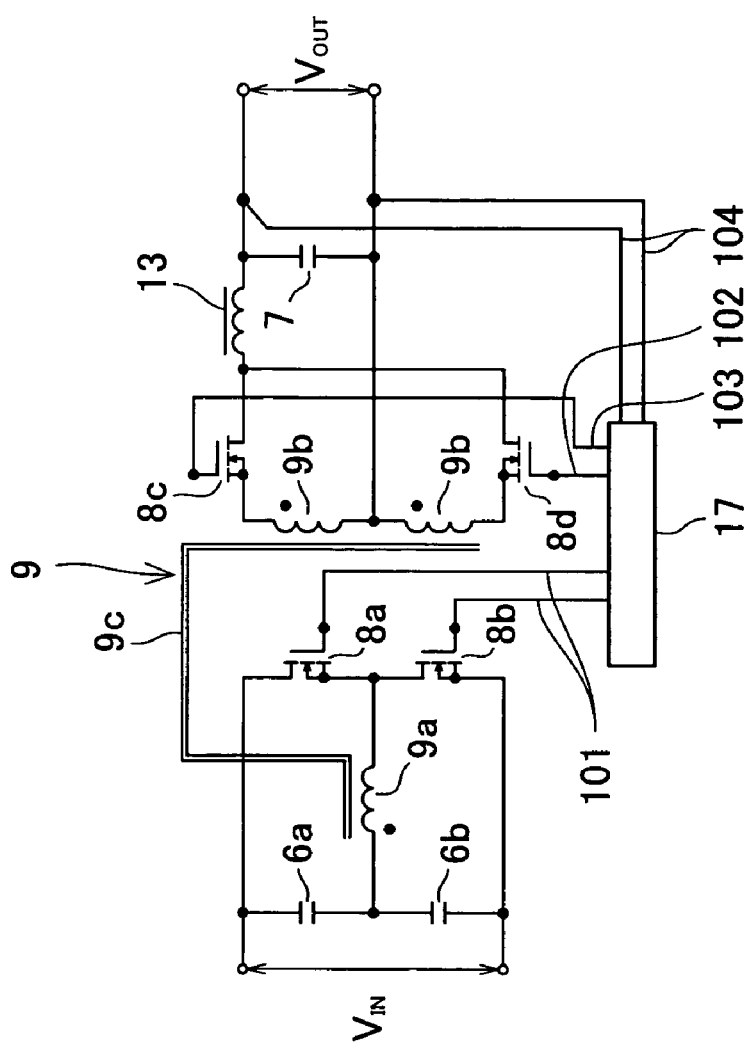
FIG. 14 is a circuit diagram of a switching power supply device according to the third preferred embodiment of the present invention that adopts a half-bridge type converter circuit.

It should be noted that although the present embodiment describes an embodiment in which the MOSFETs 8c and 8d are used as rectifier elements, bipolar transistors or IGBTs may be used in place of the MOSFETs 8c and 8d. In addition, the present embodiment has described an embodiment in which the switching power supply device uses a forward-type converter circuit as its main circuit, it is also possible to employ a configuration in which a half-bridge type converter circuit as shown in FIG. 14. By adopting such a configuration, an advantage can be obtained that very little surge voltage occurs even when a high current flows through the transformer primary winding 9a because the leakage inductance is reduced between the transformer primary winding 9a and the transformer secondary winding 9b of the transformer 9. In this case, a further advantage is obtained that the number of windings of the transformer primary winding 9a can be reduced. In other respects, the present embodiment is similar to the first preferred embodiment.

Moreover, with the switching power supply device that performs the synchronous rectification, it is possible to reduce the switching loss in the MOSFETs 8a and 8b for generating pulse voltage and the switching loss in the MOSFETs 8c and 8d used for rectification in a similar manner to the case of the switching power supply device 400 shown in FIG. 9.

Figure 15A:
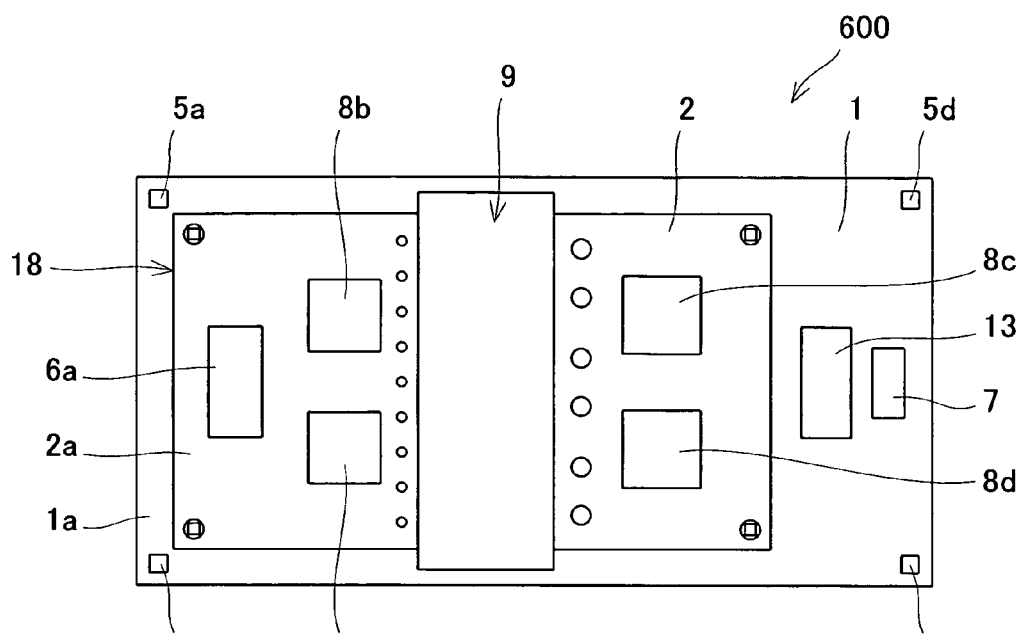
FIG. 15A is a top view thereof.
Figure 15B:
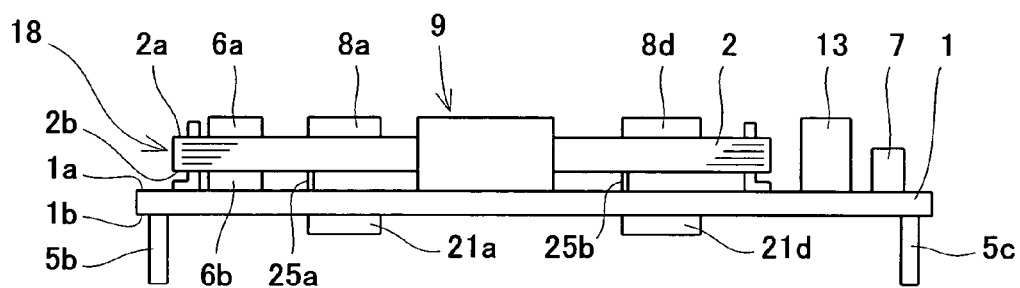
FIG. 15B is a side view thereof.
Figure 15C:
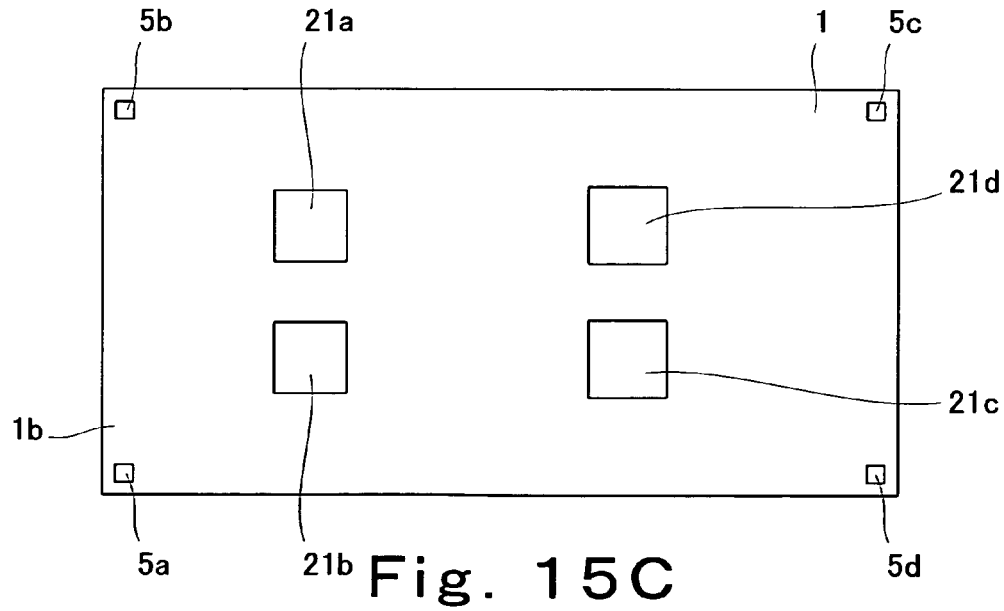
FIG. 15C is a bottom view thereof.

FIG. 15 is a configuration diagram schematically illustrating the configuration of a switching power supply device according to the third preferred embodiment of the present invention in which driver units are arranged in the vicinity of the switching circuit and the rectifier circuit. FIG. 15A is a top view thereof. FIG. 15B is a side view thereof. FIG. 15C is a bottom view thereof.

A switching power supply device 600 illustrated in FIG. 15 differs from the switching power supply device 400 illustrated in FIG. 9 in that the synchronous rectification performed by the MOSFETs 8c and 8d is employed in place of the rectification performed by the diodes 10a and 10b. That is, as shown in FIG. 15A, the diodes 10a and 10b in the switching power supply device 400 illustrated in FIG. 9A are replaced with the MOSFETs 8c and 8d in the switching power supply device 600. In addition, as shown in FIGS. 15B and 15C, in the switching power supply device 600 according to the present embodiment, driver units 21a and 21b for enabling the MOSFETs 8a and 8b to perform switching operations are arranged on the second major surface 1b of the main printed circuit board 1 at the positions that oppose the MOSFETs 8a and 8b across the thickness of the multi-layer printed circuit board 2. In other words, the driver units 21a and 21b are arranged on the second major surface 1b of the main printed circuit board 1 at the positions that are substantially at the shortest distance from the MOSFETs 8a and 8b. Further, the MOSFETs 8a and 8b and the driver units 21a and 21b are electrically connected to each other by a wiring line 25a made of a lead wire or the like via a through hole (not shown) in the main printed circuit board 1 and a through hole (not shown) in the multi-layer printed circuit board 2. That is, the MOSFETs 8a and 8b and the driver units 21a and 21b are connected to each other by a wiring line connecting them substantially in the shortest distance.

In addition, as shown in FIGS. 15B and 15C, in the switching power supply device 600 according to the present embodiment, driver units 21c and 21d for enabling the MOSFETs 8c and 8d to perform switching operations are arranged on the second major surface 1b of the main printed circuit board 1 at the positions that oppose the MOSFETs 8c and 8d across the thickness of the multi-layer printed circuit board 2. In other words, the driver units 21c and 21d are arranged on the second major surface 1b of the main printed circuit board 1 at the positions that are substantially at the shortest distance from the MOSFETs 8c and 8d. Further, the MOSFETs 8c and 8d and the driver units 21c and 21d are electrically connected to each other by a wiring line 25b made of a lead wire or the like via a through hole (not shown) in the main printed circuit board 1 and a through hole (not shown) in the multi-layer printed circuit board 2. That is, the MOSFETs 8c and 8d and the driver units 21c and 21d are connected to each other by a wiring line that connects them substantially in the shortest distance. In this respect, the configuration of the switching power supply device 600 described in the present embodiment differs from that of the switching power supply device 400 that has been described in the first preferred embodiment. The rest of the configuration is similar to that of the switching power supply device 100 in the present embodiment and is therefore not further elaborated upon here.

It should be noted that in the present embodiment, all the driver units 21a to 21d are provided within the control circuit 17. Also, the configuration of the driver units 21a and 21b and the configuration of the driver units 21c and 21d are basically the same. Further, the driver units 21c and 21d are connected to the MOSFETs 8c and 8d by wiring lines 102 and 103, as shown in FIGS. 10, 13, and 14.

In the switching power supply device 600 having such a configuration, the MOSFETs 8a to 8d and the driver units 21a to 21d are arranged so as to be at the shortest distance, and are connected by the wiring lines connecting them in the shortest distance. Therefore, it becomes possible to reduce the parasitic inductance existing in the wiring lines for electrically connecting the MOSFETs 8a to 8d and the driver units 21a to 21d. This makes it possible to reduce the current suppressing effect in the wiring lines. Therefore, a high-speed switching operation of the MOSFETs 8a to 8d becomes possible, and it becomes possible to reduce switching loss in the switching elements.

Fourth Preferred Embodiment

Figure 16:
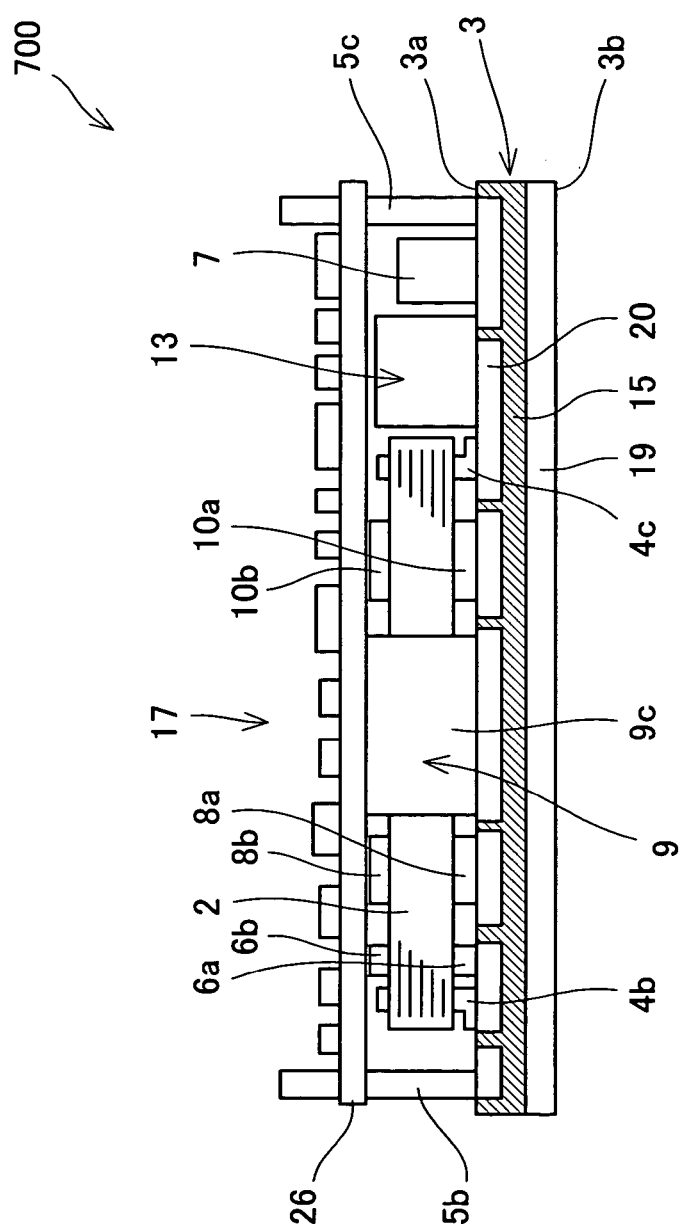
FIG. 16 is a side view schematically illustrating the structure of a switching power supply device according to a fourth preferred embodiment of the present invention.

FIG. 16 is a side view schematically illustrating the structure of a switching power supply device 700 according to a fourth preferred embodiment of the present invention. The circuit diagram of the switching power supply device 700 described in the present embodiment is identical to the circuit diagram of the switching power supply device 100 that has been illustrated in FIG. 4 in the first preferred embodiment. For this reason, the description concerning the circuit diagram and operation of the switching power supply device 700 of the present embodiment will be omitted. In addition, the multi-layer printed circuit board 2 and a control circuit board 26 on which the control circuit 17 illustrated in FIG. 16 are formed to have substantially the same configuration as those of the multi-layer printed circuit board 2 and the main printed circuit board 1 of the switching power supply device 100 described in the first preferred embodiment. For this reason, the description concerning the multi-layer printed circuit board 2 and the control circuit board 26 will be omitted here.

As shown in FIG. 16, a switching power supply device 700 according to the present embodiment is configured to comprise: a lead frame board 3 (main wiring board) in which a heat sink 19 and a lead-frame-board wire 20 are stacked with an electrically insulative member 15 interposed therebetween; connecting terminals 5a, 5b, 5c, and 5d extending in a substantially vertical direction from four corners of the lead frame board 3 (the connecting terminals 5a and 5d exist behind the connecting terminals 5b and 5c); a multi-layer printed circuit board 2 having connecting terminal 4a, 4b, 4c, 4d (connecting terminals 4a and 4d exist behind the connecting terminals 4b and 4c); an inductance 13; an output smoothing capacitor 7; and a control circuit board 26 on which a control circuit 17 is formed.

The lead frame board 3 is configured by stacking the lead-frame-board wiring 20 and the heat sink 19 formed into a predetermined shape with the electrically insulative member 15 interposed therebetween. The electrically insulative member 15 is composed of a mixture of an inorganic filler and an electrically insulative resin at least including a thermosetting resin.

Here, it is preferable that the thermosetting resin that constitutes the electrically insulative resin be at least one of epoxy resin, phenolic resin, cyanate resin, fluoroplastic, polyester, polyphenylene-ether, or polyimide. The reason is that these thermosetting resins have excellent heat resistance and electrical insulation performance at high temperatures, and therefore, it becomes possible to form an electrically insulative member 15 with good physical and electrical properties. In particular, epoxy-based resins are traditionally used suitably for sealing resins for use in semiconductor integrated circuits such as ICs and LSIs, for printed circuit boards or the like, and they are capable of forming an electrically insulative member 15 that exhibits not only good electrical properties but also good chemical resistance, mechanical performance (mechanical strength), and the like.

It is preferable that the inorganic filler be at least one of aluminum oxide, magnesium oxide, boron nitride, aluminum nitride, silicon dioxide, silicon carbide, or ferrite. The reason is that by mixing such an inorganic filler with the above-mentioned thermosetting resin, the thermal conductivity of the electrically insulative member 15 can be remarkably enhanced. In particular, when using magnesium oxide as the inorganic filler, it becomes possible to increase the thermal expansion coefficient of the electrically insulative member 15 and to improve the thermal conductivity of the electrically insulative member 15. Conversely, by using silicon dioxide (particularly, an amorphous material thereof) as the inorganic filler, the thermal expansion coefficient and relative dielectric constant of the electrically insulative member 15 can be reduced. It is preferable that the addition amount of the inorganic filler be about 70 to 95 weight % with respect to the weight of the electrically insulative member 15. When a further desirable thermal conductivity is required, it is preferable that the addition amount of the inorganic filler be 88 weight % or greater.

The lead-frame-board wire 20, which is arranged on a first major surface 3a of the lead frame board 3 is formed in a predetermined shape so that the multi-layer printed circuit board 2, the inductance 13, the output smoothing capacitor 7, and the control circuit 17 respectively form predetermined circuits. Desirable materials for the lead-frame-board wire 20 include, but are not particularly limited to, copper, aluminum, and the like that are generally used as a material for wiring. The heat sink 19 arranged on a second major surface 3b of the lead frame board 3 is a plate-shaped metal plate formed into a substantially planer surface state. Desirable materials for the heat sink 19 include, but are not particularly limited to, materials having a relatively large thermal conductivity, such as copper, aluminum, and the like.

The multi-layer printed circuit board 2, the inductance 13, and the output smoothing capacitor 7 are arranged at respective predetermined positions on the lead-frame-board wire 20 in the first major surface 3a of the lead frame board 3. The multi-layer printed circuit board 2 is arranged on the lead-frame-board wire 20 so that an input smoothing capacitor 6a, a MOSFET 8a, and a diode 10a come in contact with the lead-frame-board wire 20 formed on the first major surface 3a of the lead frame board 3. Four connecting terminals 5a to 5d each having substantially the same length extend from predetermined positions at four corners of the lead-frame-board wire 20 in a substantially vertical direction with respect to the lead frame board 3. These connecting terminals 5a to 5d are fixed at predetermined positions on the lead-frame-board wire 20 so as to be electrically connected to the lead-frame-board wire 20 of the lead frame board 3.

On the other hand, the fore-ends of the connecting terminals 5a to 5d are inserted into holes such as corresponding through holes formed at predetermined positions on the four corners of the control circuit board 26. The fore-ends of the connecting terminals 5a to 5d are electrically connected with the corresponding through holes or the like by a predetermined fixing means such as soldering. With this configuration, the connecting terminals 5a to 5d support the control circuit board 26 from below.

The switching power supply device 700 thus configured can also operate in a similar fashion to the switching power supply device 100 described in the first preferred embodiment, and can attain similar advantageous effects. Moreover, in the switching power supply device 700 described in the present embodiment, the elements arranged on the multi-layer printed circuit board 2 such as the MOSFETs 8a and 8b, the transformer 9, the diodes 10a and 10b, and the inductance 13, particularly the elements through which a high-frequency switching current or an alternating current flows at a high current, are arranged so as to be in contact with the lead frame board 3, which has a large thermal conductivity. Therefore, even in the case where those active elements, passive elements, and so forth generate heat, the heat can be released to the outside of the switching power supply device 700. That is, an advantageous effect can be obtained that even when, for example, the switching power supply device 700 is operated for a long time, the switching power supply device 700 operates stably. In other respects, this embodiment is similar to the case of the first preferred embodiment.

Furthermore, by utilizing the lead-frame-board wire 20 of the lead frame board 3 to electrically connect the lead frame board 3 and the multi-layer printed circuit board 2, it becomes possible to reduce the electrical connection resistance between the lead frame board 3 and the multi-layer printed circuit board 2 and to dissipate the heat generated from the multi-layer printed circuit board 2 and the electronic components and the like mounted on the multi-layer printed circuit board 2 effectively to the lead frame board 3.

Figure 17:
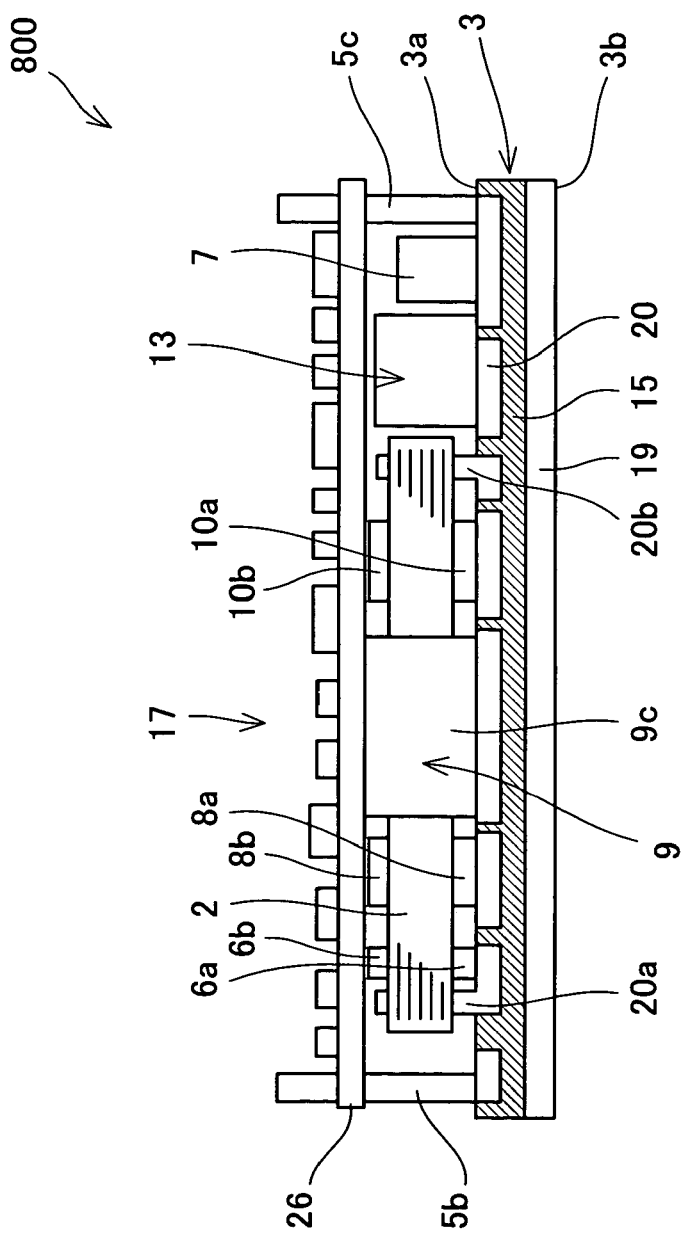
FIG. 17 is a side view schematically illustrating the structure of another switching power supply device according to the fourth preferred embodiment of the present invention.

FIG. 17 is a side view schematically illustrating another switching power supply device according to the fourth preferred embodiment of the present invention.

As shown in FIG. 17, a switching power supply device 800 according to the present embodiment has substantially the same configuration as that of the switching power supply device 700 illustrated in FIG. 16. However, in the switching power supply device 700 illustrated in FIG. 16, the multi-layer printed circuit board 2 and the lead frame board 3 are connected by the connecting terminals 4a to 4d. By contrast, in the switching power supply device 800 illustrated in FIG. 17, the multi-layer printed circuit board 2 and the lead frame board 3 are connected by the connecting terminals 20a and 20b formed by changing the shape of portions of the lead-frame-board wire 20 so as to extend in a substantially vertical direction. Here, the connecting terminals 20a and 20b and wiring lines (not particularly shown in the figure) of the multi-layer printed circuit board 2 are electrically connected by a connecting means such as soldering. In this respect, the configuration of the switching power supply device 800 differs from that of the switching power supply device 700.

Thus, when the connecting terminals 20a and 20b are formed by changing the shape of portions of the lead-frame-board wire 20 of the lead frame board 3 such as to extend in a substantially vertical direction and the lead frame board 3 and the multi-layer printed circuit board 2 are connected using the connecting terminals 20a and 20b, it becomes unnecessary to use all or some of the connecting terminals 4a to 4d, which have conventionally been used. In addition, it becomes possible to reduce the electrical connection resistance between the lead frame board 3 and the multi-layer printed circuit board 2, and to dissipate the heat generated from the multi-layer printed circuit board 2 and the electronic components and the like mounted on the multi-layer printed circuit board 2 effectively to the lead frame board 3.

Fifth Preferred Embodiment

Figure 18:
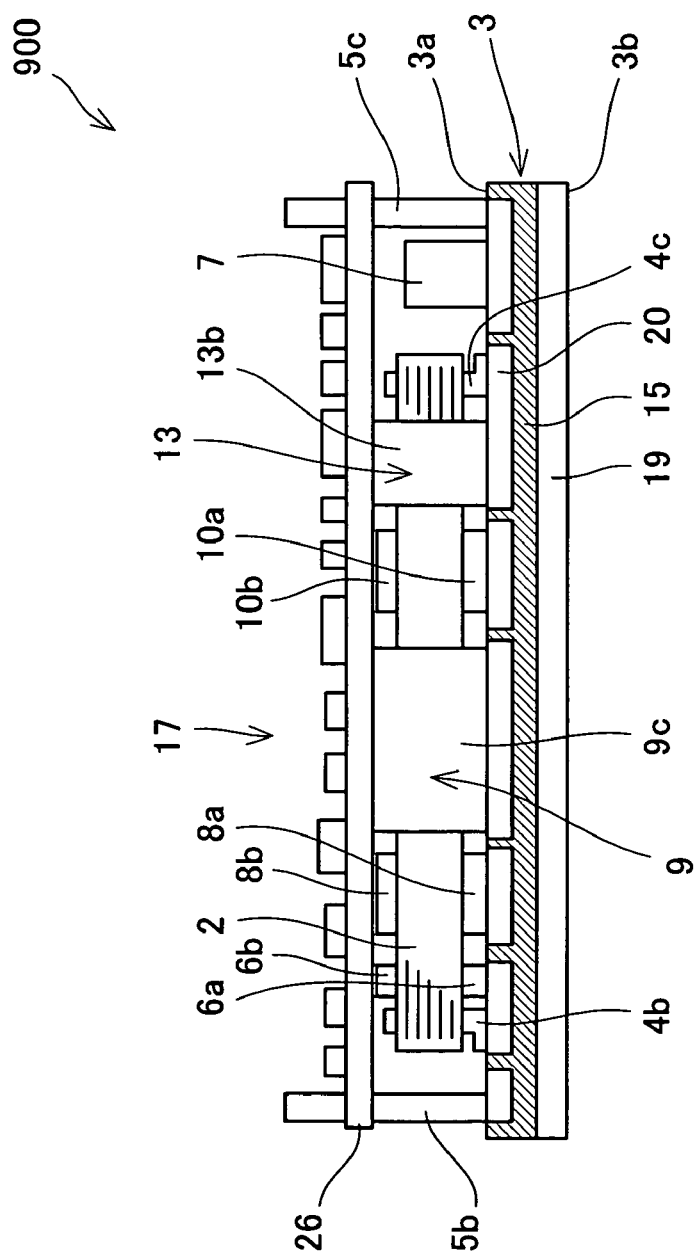
FIG. 18 is a side view schematically illustrating the structure of a switching power supply device according to a fifth preferred embodiment of the present invention.

FIG. 18 is a side view schematically illustrating the structure of a switching power supply device 900 according to a fifth preferred embodiment of the present invention. The switching power supply device 900 described in the present embodiment has substantially the same configuration as that of the switching power supply device 700 that has been described in the fourth preferred embodiment. However, the switching power supply device 900 according to the present embodiment differs from the switching power supply device 700 of the fourth preferred embodiment in that the shape and arrangement position of the inductance 13. The shape and arrangement position of the inductance 13 are the same as those in the case of the switching power supply device 500 described in the second preferred embodiment. For this reason, the detailed description thereof will be omitted here.

The switching power supply device 900 thus configured can also operate in a similar fashion to the switching power supply device 100 described in the first preferred embodiment, and can attain similar advantageous effects. Moreover, in the switching power supply device 900 described in the present embodiment too, the elements arranged on the multi-layer printed circuit board 2 such as the MOSFETs 8a and 8b, the transformer 9, the diodes 10a and 10b, and the inductance 13, particularly the elements through which a high-frequency switching current or an alternating current flows at a high current, are arranged so as to be in contact with the lead frame board 3, which has a large thermal conductivity. Therefore, even in the case where those active elements, passive elements, and so forth generate heat, the heat can be released to the outside of the switching power supply device 900. That is, an advantageous effect can be obtained that even when, for example, the switching power supply device 900 is operated for a long time, the switching power supply device 900 operates stably. In other respects, this embodiment is similar to the case of the first preferred embodiment.

In the present embodiment as well, by electrically connecting the lead frame board 3 and the multi-layer printed circuit board 2 utilizing the lead-frame-board wire 20 of the lead frame board 3, it becomes possible to reduce the electrical connection resistance between the lead frame board 3 and the multi-layer printed circuit board 2, and to dissipate the heat generated from the multi-layer printed circuit board 2 and the electronic components and the like mounted on the multi-layer printed circuit board 2 effectively to the lead frame board 3, as in the case of the switching power supply device 800 according to the fourth preferred embodiment.

It should be noted that the foregoing description has described various examples of switching power supply devices, but the present invention is also applicable to simple power supplies and other general electronic devices.

The present invention can be embodied by such means as have been described above, and it can exhibit an advantageous effect that it becomes possible to provide a small-sized, highly efficient switching power supply device that is capable of supplying a direct current at a low voltage and a high current with a constant voltage irrespective of the power consumption of the load.

Furthermore, the switching power supply device according to the invention is useful as a small-sized, highly efficient switching power supply device that is incorporated in the interior of electronic equipment and is capable of supplying a direct current at a low voltage and a high current with a constant voltage irrespective of the power consumption of the load.

From the foregoing description, numerous improvements and other embodiments of the present invention will be readily apparent to those skilled in the art. Accordingly, the foregoing description is to be construed only as illustrative examples and as being presented for the purpose of suggesting the best mode for carrying out the invention to those skilled in the art. Modifications may be made in specific structures and/or functions substantially without departing from the sprit of the present invention.

What is claimed is:

1. A switching power supply device comprising:
   a switching circuit for interrupting direct current to generate a pulse voltage;
   a transformer including a primary winding, a secondary winding, and a core for magnetically coupling the primary winding and the secondary winding;
   a multi-layer wiring board having wiring constituting the primary winding and the secondary winding;
   a rectifier circuit for rectifying an alternating current;
   a smoothing circuit for suppressing ripple; and
   a control circuit for controlling an output voltage from the smoothing circuit,
   the switching power supply device being for outputting a direct current obtained by applying the pulse voltage to a first connecting portion of the primary winding to induce an alternating current in a second connecting portion of the secondary winding, rectifying the alternating current by the rectifier circuit, and smoothing the alternating current by the smoothing circuit,
   wherein the multi-layer wiring board is provided with at least the switching circuit and the rectifier circuit and is arranged on a main wiring board, and the control circuit is arranged on the main wiring board.

2. The switching power supply device according to claim 1, wherein:
   the core has a center leg portion, and
   the first connecting portion and the second connecting portion of the transformer are arranged on opposing sides of the center leg portion along the shorter axis of the center leg portion.

3. The switching power supply device according to claim 2, wherein:
   the switching circuit and the rectifier circuit are respectively arranged on the first connecting portion-side and the second connecting portion-side; and
   the first connecting portion and the switching circuit, as well as the second connecting portion and the rectifier circuit, are arranged so as to have a portion in which the first connecting portion is electrically coupled directly with the switching circuit and a portion in which the second connecting portion is electrically coupled directly with the rectifier circuit, respectively.

4. The switching power supply device according to claim 1, wherein the multi-layer wiring board is arranged on a first major surface of the main wiring board, and the control circuit is arranged on a second major surface of the main wiring board.

5. The switching power supply device according to claim 4, wherein only the control circuit is arranged on the second major surface of the main wiring board.

6. The switching power supply device according to claim 1, wherein:
   the control circuit has a driver unit for driving the switching circuit so that the switching circuit generates the pulse voltage; and
   the driver unit is arranged on the main wiring board substantially at the shortest distance from the switching circuit and is connected with the switching circuit by a wiring substantially in the shortest distance therefrom.

7. The switching power supply device according to claim 1, wherein:
   the control circuit has a driver unit for driving the rectifier circuit so that the rectifier circuit performs the rectification operation; and
   the driver unit is arranged on the main wiring board substantially at the shortest distance from the rectifier circuit and is connected with the rectifier circuit by a wiring substantially in the shortest distance therefrom.

8. A switching power supply device comprising:
   a switching circuit for interrupting direct current to generate a pulse voltage;
   a transformer including a primary winding, a secondary winding, and a core for magnetically coupling the primary winding and the secondary winding;
   a multi-layer wiring board having wiring constituting the primary winding and the secondary winding;
   a rectifier circuit for rectifying an alternating current;
   a smoothing circuit for suppressing ripple; and a control circuit for controlling an output voltage from the smoothing circuit, the switching power supply device being for outputting a direct current obtained by applying the pulse voltage to a first connecting portion of the primary winding to induce an alternating current in a second connecting portion of the secondary winding, rectifying the alternating current by the rectifier circuit, and smoothing the alternating current by the smoothing circuit, wherein the switching power supply device has a lead frame board in which a heat sink and a wiring layer formed substantially two-dimensionally are stacked with an electrically insulative member interposed therebetween, the electrically insulative member composed of a mixture containing at least an electrically insulative resin and a filler; and the multi-layer wiring board having at least the switching circuit and the rectifier circuit is arranged on the wiring layer of the lead frame board.

9. The switching power supply device according to claim 8, wherein:

the core has a center leg portion, and the first connecting portion and the second connecting portion of the transformer are arranged on opposing sides of the center leg portion along the shorter axis of the center leg portion.

10. The switching power supply device according to claim 9, wherein:

the switching circuit and the rectifier circuit are respectively arranged on the first connecting portion-side and the second connecting portion-side; and the first connecting portion and the switching circuit, as well as the second connecting portion and the rectifier circuit, are arranged so as to have a portion in which the first connecting portion is electrically coupled directly with the switching circuit and a portion in which the second connecting portion is electrically coupled directly with the rectifier circuit, respectively.

11. The switching power supply device according to claim 8, wherein the wiring of the multi-layer wiring board and the wiring layer of the lead frame board are connected by a portion of the wiring layer extending in a substantially vertical direction.

12. The switching power supply device according to claim 8, wherein the electrically insulative resin is one of epoxy resin, phenolic resin, cyanate resin, fluoroplastics, polyester, polyphenylene-ether, and polyimide.

13. The switching power supply device according to claim 8, wherein the filler is one of aluminum oxide, magnesium oxide, boron nitride, aluminum nitride, silicon dioxide, silicon carbide, and ferrite.

* * * * *